US012804959B2

United States Patent
Kim et al.

(10) Patent No.: US 12,804,959 B2
(45) Date of Patent: Nov. 17, 2026

(54) SEMICONDUCTOR DEVICES AND MANUFACTURING METHOD THEREOF

(71) Applicant: Samsung Electronics Co., Ltd., Suwon-si (KR)

(72) Inventors: Kihwan Kim, Seoul (KR); Sunguk Jang, Hwaseong-si (KR); Sujin Jung, Hwaseong-si (KR); Youngdae Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 449 days.

(21) Appl. No.: 17/499,979

(22) Filed: Oct. 13, 2021

(65) Prior Publication Data

US 2022/0209013 A1 Jun. 30, 2022

(30) Foreign Application Priority Data

Dec. 24, 2020 (KR) ........................ 10-2020-0183045

(51) Int. Cl.
*H10D 30/69* (2025.01)
*H10D 62/13* (2025.01)
*H10D 64/01* (2025.01)

(52) U.S. Cl.
CPC ......... *H10D 30/797* (2025.01); *H10D 62/151* (2025.01); *H10D 64/018* (2025.01)

(58) Field of Classification Search
CPC ............. H01L 29/1054; H01L 29/7848; H01L 29/0673; H01L 29/66553; H01L 29/41791; H01L 21/823425; H01L 21/02529; H01L 21/02532; H01L 21/02579; H01L 21/823418; H10D 30/62; H10D 30/6735;
(Continued)

(56) References Cited

U.S. PATENT DOCUMENTS

2005/0280098 A1* 12/2005 Shin .................. H10D 84/0174 257/E21.431
2016/0087104 A1 3/2016 Lee et al.
(Continued)

FOREIGN PATENT DOCUMENTS

CN 111415991 A 7/2020
KR 1020200036733 A 4/2020
(Continued)

*Primary Examiner* — Julio J Maldonado
*Assistant Examiner* — Nathan Pridemore
(74) *Attorney, Agent, or Firm* — Muir Patent Law, PLLC

(57) ABSTRACT

A semiconductor device includes an active region extending in a first direction; a plurality of channel layers on the active region; a gate structure extending in a second direction; and a source/drain region disposed on the active region, and connected to each of the plurality of channel layers, wherein the source/drain region includes a first epitaxial layer having a lower end portion and a sidewall portion extending continuously along lateral surfaces of the plurality of channel layers, the first epitaxial layer doped with a first impurity; and a second epitaxial layer on the first epitaxial layer, having a composition, different from a composition of the first epitaxial layer, and doped with a second impurity, wherein diffusivity of the first impurity in the composition of the first epitaxial layer is lower than the diffusivity that the second impurity would have in the composition of the first epitaxial layer.

18 Claims, 19 Drawing Sheets

(58) Field of Classification Search

CPC .... H10D 30/645; H10D 30/83; H10D 84/834; H10D 84/013–0133; H10D 84/017; H10D 84/903; H10D 84/0188; H10D 84/201; H10D 84/83; H10D 84/0107; H10D 62/149–161; H10D 62/021; H10D 62/0277; H10D 30/797; H10D 62/151; H10D 64/018; H10D 64/252; H10D 84/852; H10D 44/474; H10D 84/144; H10D 1/694; H10D 48/074; H10D 62/832; H10D 62/834; H10D 30/021; H10D 30/024; H10D 30/025; H10D 30/501; H10D 30/60; H10D 30/63; H10D 62/159; H10D 30/43; H10D 30/014; H10D 30/6757; H10D 62/121; H10D 62/822; H10D 84/0128; H10D 84/0135; H10D 84/0158; H10D 84/038; H10D 84/0144; H10D 84/0147; H10D 64/017; H10D 64/256; H10H 20/826; H02K 15/027; B65D 83/141; B65D 83/166; A61K 40/4218; B82Y 10/00; A01G 13/33; A23B 2/783; A45C 11/003; H10F 30/2863; H10P 14/3222; H10P 14/3422; H10P 14/3211; H10P 14/3411; H10P 14/3442; H10P 14/3254

See application file for complete search history.

(56) References Cited

U.S. PATENT DOCUMENTS

| | | | | |
|---|---|---|---|---|
| 2016/0104765 | A1 | 4/2016 | Ching et al. | |
| 2016/0190251 | A1 | 6/2016 | Feng et al. | |
| 2018/0047853 | A1 | 2/2018 | Chang et al. | |
| 2018/0076326 | A1* | 3/2018 | Roh | H01L 21/26513 |
| 2018/0158911 | A1* | 6/2018 | Sasaki | H01L 29/1083 |
| 2019/0067490 | A1 | 2/2019 | Yang et al. | |
| 2019/0181224 | A1 | 6/2019 | Zhang et al. | |
| 2020/0044045 | A1 | 2/2020 | Wang et al. | |
| 2020/0105606 | A1 | 4/2020 | Lin et al. | |
| 2020/0105934 | A1* | 4/2020 | Ma | H10D 30/6211 |
| 2020/0135932 | A1 | 4/2020 | Wang et al. | |
| 2020/0168722 | A1 | 5/2020 | Hung et al. | |
| 2020/0168742 | A1 | 5/2020 | Wang et al. | |
| 2020/0176566 | A1* | 6/2020 | Peng | H10D 62/151 |
| 2020/0220015 | A1* | 7/2020 | Jang | H01L 29/66795 |
| 2020/0220018 | A1* | 7/2020 | Jang | H01L 29/0847 |
| 2020/0381546 | A1* | 12/2020 | Cho | H01L 29/66439 |
| 2020/0395446 | A1* | 12/2020 | Yi | H01L 29/0673 |
| 2021/0104616 | A1* | 4/2021 | Su | H10D 64/015 |
| 2021/0151319 | A1* | 5/2021 | Kim | H01L 29/66553 |
| 2021/0257482 | A1* | 8/2021 | Chu | H01L 21/823418 |
| 2021/0375687 | A1* | 12/2021 | Lin | H01L 21/26513 |
| 2021/0407856 | A1* | 12/2021 | Wang | H01L 29/66553 |

FOREIGN PATENT DOCUMENTS

| | | | |
|---|---|---|---|
| KR | 1020200086606 | A | 7/2020 |
| KR | 1020200086607 | A | 7/2020 |
| KR | 1020210148790 | A | 12/2021 |
| KR | 102541383 | B1 | 6/2023 |

* cited by examiner

SEMICONDUCTOR DEVICES AND MANUFACTURING METHOD THEREOF

CROSS-REFERENCE TO RELATED APPLICATION(S)

This application claims benefit of priority to Korean Patent Application No. 10-2020-0183045 filed on Dec. 24, 2020, in the Korean Intellectual Property Office, the disclosure of which is incorporated herein by reference in its entirety.

BACKGROUND

The present inventive concept relates to semiconductor devices and a manufacturing method thereof.

As demand for high performance, high speed, and/or multi-functionality in semiconductor devices increases, a degree of integration of the semiconductor devices is increasing. In addition, semiconductor devices are now more often required to operate at high speed, and sometimes simultaneously with other semiconductor devices.

Recently, efforts have been made to develop a semiconductor device including a FinFET having a three-dimensional channel in order to overcome the limitations of operating characteristics due to a reduction in size of a planar metal oxide semiconductor FET (MOSFET).

SUMMARY

An aspect of the present inventive concept is to provide a semiconductor device having improved electrical characteristics.

An aspect of the present inventive concept is to provide a method of manufacturing a semiconductor device having improved electrical characteristics.

According to an aspect of the present inventive concept, a semiconductor device includes an active region disposed on a substrate and extending in a first direction; a plurality of channel layers disposed on the active region to be spaced apart from each other in a vertical direction, perpendicular to an upper surface of the substrate; a gate structure disposed on the substrate, extending in a second direction, intersecting the plurality of channel layers, and surrounding each of the plurality of channel layers; and a source/drain region disposed on the active region on at least one side of the gate structure, and connected to each of the plurality of channel layers, wherein the source/drain region comprises: a first epitaxial layer having a lower end portion and a sidewall portion extending continuously along lateral surfaces of the plurality of channel layers from the lower end portion, the first epitaxial layer doped with a first impurity; and a second epitaxial layer disposed on the first epitaxial layer, having a composition, different from a composition of the first epitaxial layer, and doped with a second impurity, different from the first impurity, wherein diffusivity of the first impurity in the composition of the first epitaxial layer is lower than the diffusivity that the second impurity would have in the composition of the first epitaxial layer.

According to an aspect of the present inventive concept, a semiconductor device includes an active region disposed on a substrate and extending in a first direction; a plurality of channel layers disposed on the active region to be spaced apart from each other in a vertical direction, perpendicular to an upper surface of the substrate; a gate structure disposed on the substrate, extending in a second direction, intersecting the plurality of channel layers, and surrounding each of the plurality of channel layers; and source/drain regions disposed on the active region on opposite sides of the gate structure and connected to each of the plurality of channel layers, wherein each of the source/drain regions comprises: a first epitaxial layer having a lower end portion and a sidewall portion extending continuously along lateral surfaces of the plurality of channel layers from the lower end portion, the first epitaxial layer including silicon germanium (SiGe) doped with at least one first impurity selected from arsenic (As) and antimony (Sb), and a second epitaxial layer disposed on the first epitaxial layer and including silicon (Si) doped with phosphorus (P) as a second impurity.

According to an aspect of the present inventive concept, a semiconductor device includes an active region disposed on a substrate and extending in a first direction; a plurality of channel layers disposed on the active region to be spaced apart from each other in a vertical direction, perpendicular to an upper surface of the substrate; a gate structure disposed on the substrate, extending in a second direction, intersecting the plurality of channel layers, and surrounding each of the plurality of channel layers; internal spacer layers disposed below each of the plurality of channel layers and disposed on opposite sides of the gate structure in the second direction; and source/drain regions disposed on the active region on the opposite sides of the gate structure, each source/drain region connected to a set of channel layers of the plurality of channel layers, wherein each of the source/drain regions comprises: a first epitaxial layer having a sidewall portion and a lower end portion continuously formed with the sidewall portion, wherein the sidewall portion contacts lateral surfaces of a respective set of channel layers of the plurality of channel layers, and the first epitaxial layer is doped with a first impurity having a first concentration, and a second epitaxial layer disposed on the first epitaxial layer, having a composition, different from a composition of the first epitaxial layer, and doped with a second impurity having a second concentration, different from the first impurity, wherein diffusivity of the first impurity in the composition of the first epitaxial layer is lower than diffusivity that would result from the second impurity being included the composition of the first epitaxial layer.

According to an aspect of the present inventive concept, a method of manufacturing a semiconductor device, includes forming a fin structure in which a plurality of sacrificial layers and a plurality of semiconductor layers are alternately stacked in an active region on a substrate; forming a dummy gate intersecting the fin structure; forming recesses by etching regions of the fin structure located on opposite sides of the dummy gate; forming first epitaxial layers doped with a first impurity on bottom and lateral surfaces of the recesses, respectively, each of the first epitaxial layers having a curved surface; reflowing the first epitaxial layers to smooth the curved surface; and forming second epitaxial layers disposed on the first epitaxial layers, respectively having a composition, different from a composition of each of the first epitaxial layers, and doped with a second impurity, different from the first impurity, diffusivity of the first impurity being lower than diffusivity that the second impurity would have in the composition of each of the first epitaxial layers.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, various embodiments of the present inventive concept will be described in detail with reference to the accompanying drawings.

Figure 1:
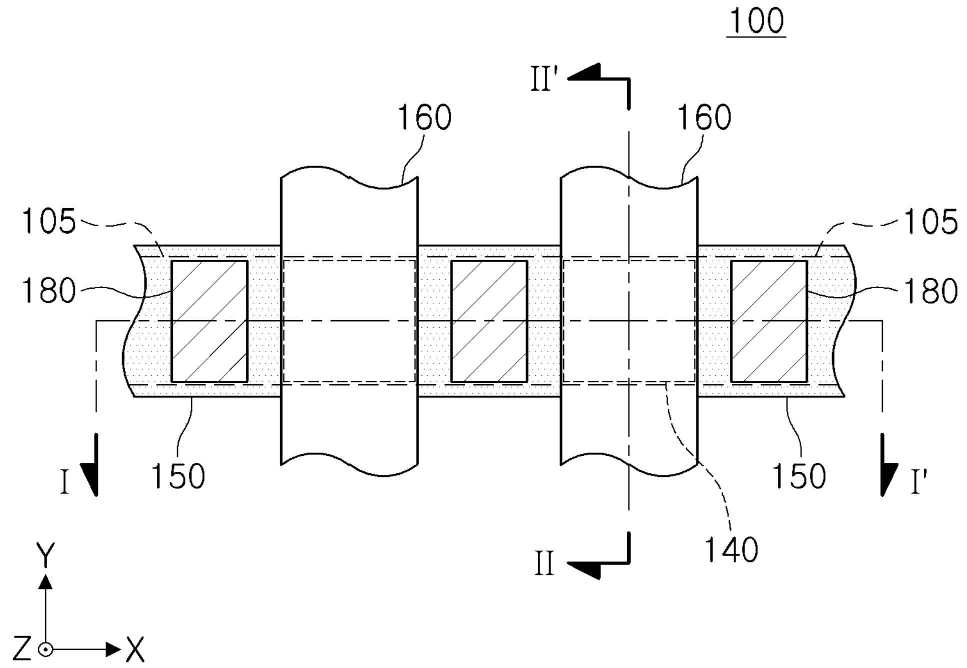
FIG. 1 is a plan view illustrating a semiconductor device according to an example embodiment of the present inventive concept.
Figure 2:
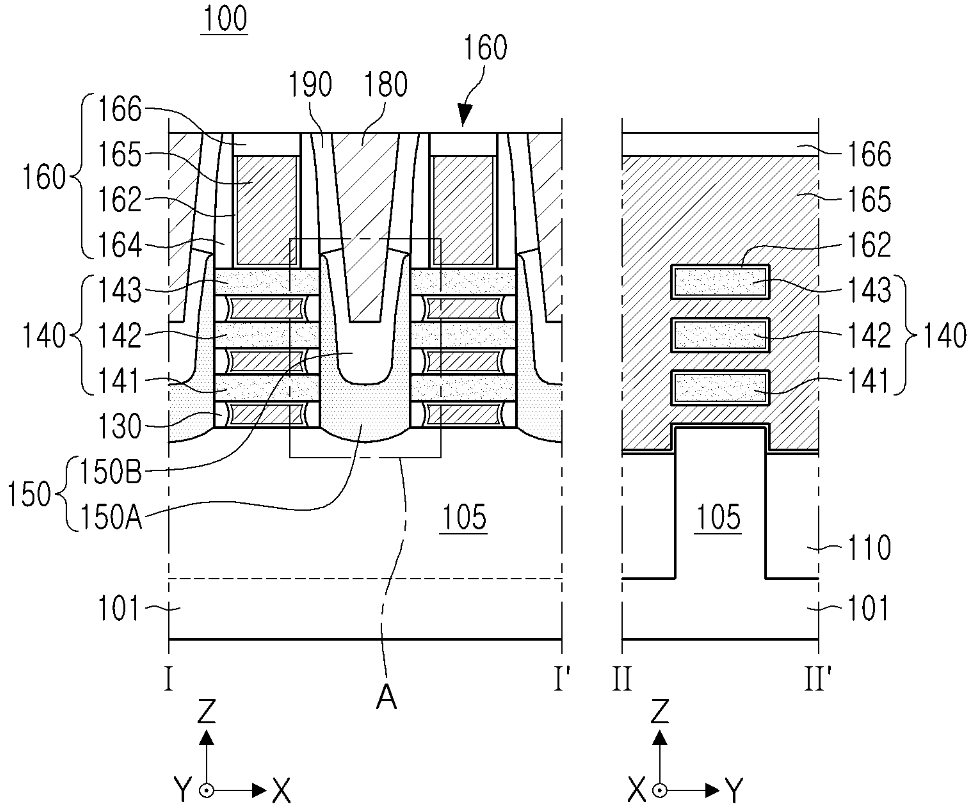
FIG. 2 is a cross-sectional view of the semiconductor device of FIG. 1, taken along lines I-I' and II-II'.

FIG. 1 is a plan view illustrating a semiconductor device according to an example embodiment of the present inventive concept, and FIG. 2 is a cross-sectional view of the semiconductor device of FIG. 1, taken along lines I-I' and Referring to FIGS. 1 and 2, a semiconductor device 100 according to this embodiment may include a substrate 101, an active region 105 disposed on the substrate 101 and extending in a first direction (e.g., an X direction), a channel structure 140 disposed on the active region 105, and a gate structure 160 extending in a second direction (e.g., a Y direction) intersecting the active region 105. The channel structure 140 may include a plurality of channel layers 141, 142, and 143, disposed on the active region 105 to be spaced apart from each other in a direction, perpendicular to an upper surface of the substrate 101 (e.g., a Z direction).

In addition, the semiconductor device 100 may further include source/drain regions 150 disposed on both (e.g., opposite) sides of the gate structure 160 and contacting the plurality of channel layers 141, 142, and 143, and contact plugs 180 connected to the source/drain regions 150. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

In the embodiment of FIGS. 1 and 2, the active region 105 may have a fin structure extending and protruding in the first direction (e.g., the X direction). For example, the substrate 101 may be a semiconductor substrate such as a silicon substrate or a germanium substrate, or a silicon-on-insulator (SOI) substrate. A device isolation film 110 may define the active region 105, and may include, for example, an oxide film, a nitride film, or a combination thereof. The device isolation film 110 may define the active region 105 in the substrate 101. The device isolation film 110 may be disposed on the substrate 101 to cover a lateral surface of the active region 105 of the substrate 101. For example, the device isolation film 110 may be formed by a shallow trench isolation (STI) process. In some embodiments, the device isolation film 110 may further include a region (e.g., deep trench isolation (DTI)) having a step difference below the substrate 101 and extending deeper.

The device isolation film 110 may be formed to expose an upper region of the active region 105, for example, with respect to the device isolation film 110. In some embodiments, the device isolation film 110 may have a curved upper surface having a higher level as it may be adjacent to the active region 105. The device isolation film 110 may be formed of an insulating material.

Referring to FIG. 2, an upper end of the active region 105 may protrude from the upper surface of the device isolation film 110 to a predetermined height. The active region 105 may include a portion of the substrate 101 or an epitaxial layer grown from the substrate 101. The active region 105 may be described as being provided with the substrate 101, or as formed on or of the substrate. A portion of the active region 105 on or of the substrate 101, located on opposite sides of the gate structures 160, may be recessed, and the source/drain regions 150 may be formed in the recessed region. Details of the source/drain regions 150 employed in this embodiment will be described later.

As illustrated in FIG. 2, the gate structure 160 may include a gate electrode 165 extending in the second direction (e.g., the Y direction) and surrounding the plurality of channel layers 141, 142, and 143, a gate dielectric layer 162 disposed between the gate electrode 165 and each of the plurality of channel layers 141, 142, and 143, gate spacer layers 164, also described as gate spacers, disposed on lateral surfaces of the gate electrode 165, and a gate capping layer 166 disposed on the gate electrode 165.

As described above, the semiconductor device 100 according to this embodiment may be a gate-all-around field-effect transistor (e.g., an N-MOS transistor) including the channel structures 140, the source/drain regions 150, and the gate structures 160.

Specifically, the channel structure 140 may include the first to third channel layers 141, 142, and 143, disposed on the active region 105 to be spaced apart from each other in a direction, perpendicular to the upper surface of the substrate 101 (e.g., the Z direction). Both lateral surfaces of the first to third channel layers 141, 142, and 143 in the first direction (the X direction) may be in contact with the source/drain regions 150.

The first to third channel layers 141, 142, and 143 may have a width, identical or similar to a width of the active region 105 in the second direction (the Y direction), and a width, identical or similar to a width of the gate structure 160 in the first direction (the X direction), respectively, but are not limited thereto. In some embodiments, the widths of the first to third channel layers 141, 142, and 143 may be slightly different from each other. For example, a width (in either of the first, X direction or second, Y direction) of the first channel layer 141 may be wider than a respective width of the second channel layer 142. In addition, in some embodiments, when viewed in the first direction (the X direction), the width of each of first to third channel layers 141, 142, and 143 in the second direction (the Y direction) may be narrower than the width of the gate structure 160 such that lateral surfaces of each of the first to third channel layers 141, 142, and 143 are located below the gate structure 160 (see FIG. 9). Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

The first to third channel layers 141, 142, and 143 may include a semiconductor material capable of providing and acting as a channel region. For example, the first to third channel layers 141, 142, and 143 may include or be formed of at least one of silicon (Si), silicon germanium (SiGe), or germanium (Ge). The first to third channel layers 141, 142, and 143 may be formed of the same material as the substrate 101, for example. In some embodiments, a region of the first to third channel layers 141, 142, and 143 adjacent to the source/drain regions 150 may include an impurity region. Since such an impurity region has a short channel effect (SCE), a manner of preparing such an impurity region is important. In some embodiments, although three (3) channel layers 141, 142, and 143 are illustrated, the number and shapes of the channel layers 141, 142, and 143 may be variously changed (see FIGS. 6 to 10).

The source/drain regions 150 may be disposed on the active region 105 on both sides of the channel structure 140 as described above.

Figure 3:
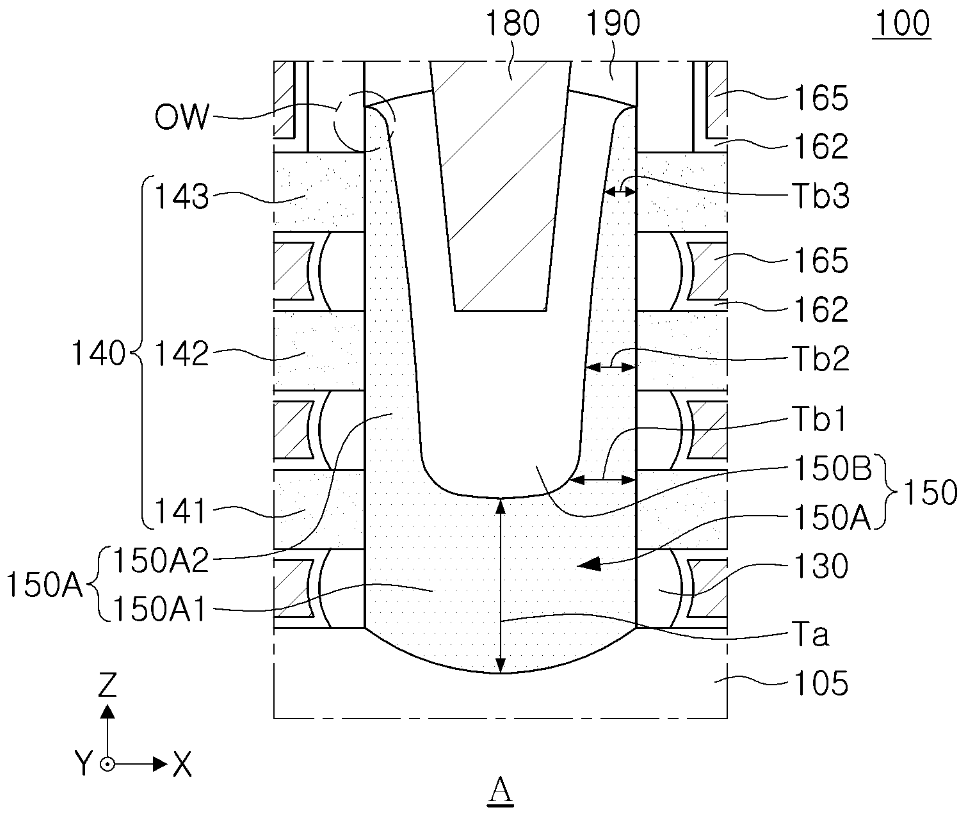
FIG. 3 is a partially enlarged view illustrating portion "A" of the semiconductor device of FIG. 2.

Referring to FIGS. 2 and 3, the source/drain region 150 employed in this embodiment may include a first epitaxial layer 150A continuously disposed in a recess, and a second epitaxial layer 150B disposed on the first epitaxial layer 150A. The first epitaxial layer 150A may have a lower end portion 150A1 of the source/drain region 150 and a sidewall portion 150A2 continuously extending from the lower end portion 150A1 along lateral surfaces of the first to third channel layers 141, 142, and 143. The sidewall portion 150A2 of the first epitaxial layer 150A may be continuously formed along lateral surfaces of the recesses. In this embodiment, the sidewall portion 150A2 of the first epitaxial layer 150A may contact the lateral surfaces of the plurality of channel layers 141, 142, and 143. In this manner, the first epitaxial layer 150A may extend continuously, to be formed of a single continuous integrated structure, while contacting each of the lateral surfaces of the plurality of channel layers 141, 142, and 143. In the example of FIGS. 2 and 3, there is no grain boundary between the lower end portion 150A1 and the sidewall portion 150A2 of the first epitaxial layer 150A. The lower end portion 150A1 and sidewall portion 150A2 may be respectfully referred to as a base portion and extension portions. The lower end portion 150A1 and the sidewall portion 150A2 may have the same material composition.

In embodiment of FIGS. 1-3, the sidewall portion 150A2 of the first epitaxial layer 150A may have a smooth surface. The sidewall portion 150A2 of the first epitaxial layer 150A may become thinner toward an upper portion of the first epitaxial layer 150A (e.g., in a direction away from the substrate 101. Specifically, as illustrated in FIG. 3, a thickness Tb2 of a portion of the sidewall portion 150A2 located on a lateral surface of a second channel layer 142 may be less than a thickness Tb1 of a portion of the sidewall portion 150A2 located on a lateral surface of a first channel layer 141, and a thickness Tb3 of a portion of the sidewall portion 150A2 located on a lateral surface of a third channel layer 143 may be less than the thickness Tb2 of the portion of the sidewall portion 150A2 located on the lateral surface of the second channel layer 142. The thicknesses Tb1, Tb2, and Tb3 may be referred to herein respectively as a bottom thickness, mid thickness, and top thickness of the sidewall portion 150A2 of the first epitaxial layer 150A. Thus, the sidewall portion 150A2 may get thinner from a bottom thickness to a mid thickness to a top thickness. The sidewall portion 150A2 may have an average thickness. In some embodiments, a portion located on the lateral surface of the first channel layer 141 may be provided as the lower portion 150A1, instead of the sidewall portion 150A2. In some embodiments, a shape of the sidewall portion 150A2 may be implemented by a reflow process (see FIGS. 11G and 11H). In particular, the first epitaxial layer 150A may have a portion OW extending above an upper surface of the third channel layer 143, and the extended portion OW may be thinner than the thickness Tb3 on the lateral surface of the third channel layer 143, and may become thinner toward the upper portion of the first epitaxial layer 150A. The sidewall portions 150A2 of the first epitaxial layer 150A may have tapered shape in a direction moving away from a top of the substrate 101.

In the first epitaxial layer 150A employed in one embodiment, since the sidewall portion 150A2 is reflowed to the bottom portion 150A1 by a reflow process applied after epitaxial growth, the sidewall portion 150A2 as described above may become relatively thin and have a relatively smooth surface, and the bottom portion 150A1 may have a thickness Ta greater than the thickness Tb2 of the sidewall portion 150A2. A thickness of the sidewall portion 150A2 may be defined as the thickness Tb2 of a portion of the first epitaxial layer 150A located on the lateral surface of the second channel layer 142 located in a central portion of the plurality of channel layers 141, 142, and 143. For example, in the first epitaxial layer 150A, the thickness Ta of the bottom portion 150A1 may be in a range from 3.5 to 5 times the thickness Tb2 of the sidewall portion 150A2. In some embodiments, in the first epitaxial layer 150A, the thickness Ta of the bottom portion 150A1 is in a range from 3.5 to 5 times the average thickness of the sidewall portion 150A2. In some embodiments, the thickness Ta of the lower portion 150A1 may be 10 nm to 25 nm, and the thickness Tb2, or the average thickness, of the sidewall portion 150A2 may be 3 nm to 7 nm, but these thicknesses are not limited thereto. Unless otherwise noted, the thicknesses Ta and Tb1 through Tb3 refer herein to a thickness of the epitaxial layer with respect to a surface on which it is deposited. So the thickness Ta refers to a thickness in a Z direction, while the thicknesses Tb1 through Tb3 refer to a thickness in an X direction.

The second epitaxial layer 150B may be disposed on the first epitaxial layer. The second epitaxial layer 150B may have a convex shape in an upward direction, but is not limited thereto. A shape of a lower surface of the source/drain regions 150 is illustrated to show a convex shape in a downward direction, but may have other shapes such as a planar shape.

In one embodiment, the first epitaxial layer 150A and the second epitaxial layer 150B may have different compositions. For example, each of the first and second epitaxial layers 150A and 150B may be silicon germanium (SiGe), silicon (Si), or silicon carbide (SiC), or may include at least one of silicon germanium (SiGe), silicon (Si), or silicon carbide (SiC).

In some embodiments (e.g., N-MOSFET), the first epitaxial layer 150A may include or may be silicon germanium (SiGe). Ge—Ge binding energy (e.g. 264.4 KJ/mol) and Ge—Si binding energy (e.g. 297 KJ/mol) may be significantly lower than Si—Si binding energy (e.g. 310 KJ/mol). Therefore, a material in which Ge is added to Si may be used for the first epitaxial layer 150A, to lower a reflow process temperature for the first epitaxial layer 150A. In addition, a lower reflow process temperature may reduce intermixing between a constituent material (e.g., Si) of the plurality of channel layers 141, 142, and 143 and a constituent material (e.g., SiGe) of the first epitaxial layer, thereby effectively restricting a short channel effect (SCE).

The second epitaxial layer 150B may be or may include silicon (Si) and/or silicon carbide (SiC). For example, in an N-MOSFET, the second epitaxial layer 150B may provide tensile strain to the plurality of channel layers 141, 142, and 143 (e.g., Si).

As described above, the first epitaxial layer 150A employed in this embodiment may have a composition having lower binding energy (or bonding dissociation energy) than a composition of the second epitaxial layer 150B. As a result, when a first epitaxial layer 150A is formed of SiGe, the first epitaxial layer 150A may be more easily converted into a continuous layer having a smooth surface by a reflow process.

In one embodiment, the first epitaxial layer 150A may have a first impurity, and the second epitaxial layer 150B may include a second impurity, different from the first impurity.

In the composition of the first epitaxial layer 150A, the first impurity may be selected as an element having diffusivity (or a diffusion coefficient), lower than diffusivity (or diffusion coefficient) of the second impurity. For example, in an N-MOSFET, the first impurity may include at least one of arsenic (As) or antimony (Sb), and the second impurity may include phosphorus (P).

Diffusivity of such impurities may be greatly influenced by a composition of a matrix, e.g., a composition of the first epitaxial layer 150A. The first epitaxial layer 150A may have a composition satisfying a condition in which diffusivity of the first impurity is lower than diffusivity of the second impurity. In SiGe of the first epitaxial layer 150A, a composition ratio of Ge (e.g. atoms of Ge compared to total atoms of Si and Ge) may be adjusted to 15% or less, and further to 10% or less, such that diffusivity of the first impurity may be sufficiently lower than diffusivity of the second impurity. These conditions will be described in detail with reference to FIGS. 4A and 4B, and FIG. 5.

Figure 4A:
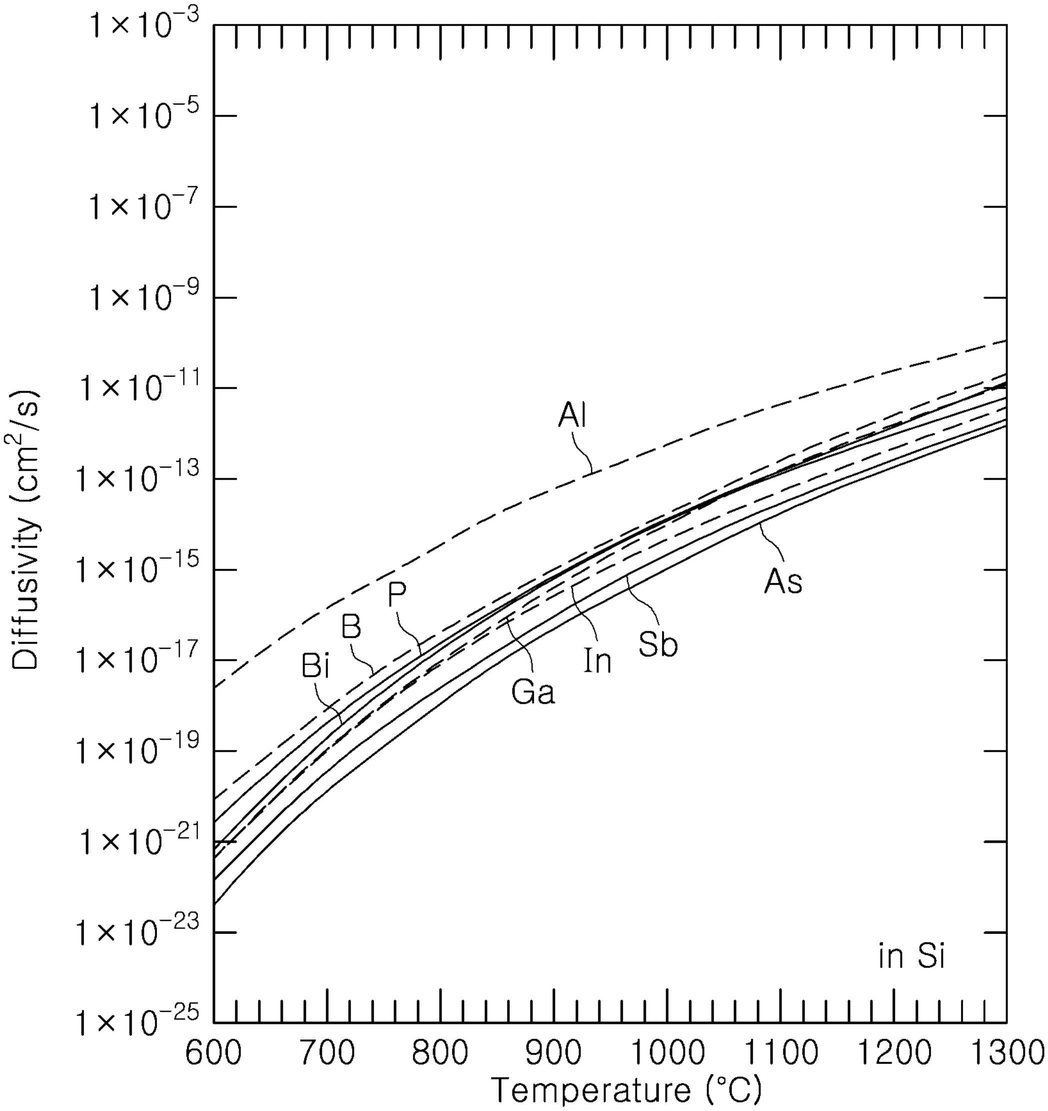
FIGS. 4A and 4B are graphs illustrating diffusivity according to an impurity type in silicon and germanium, respectively.
Figure 4B:
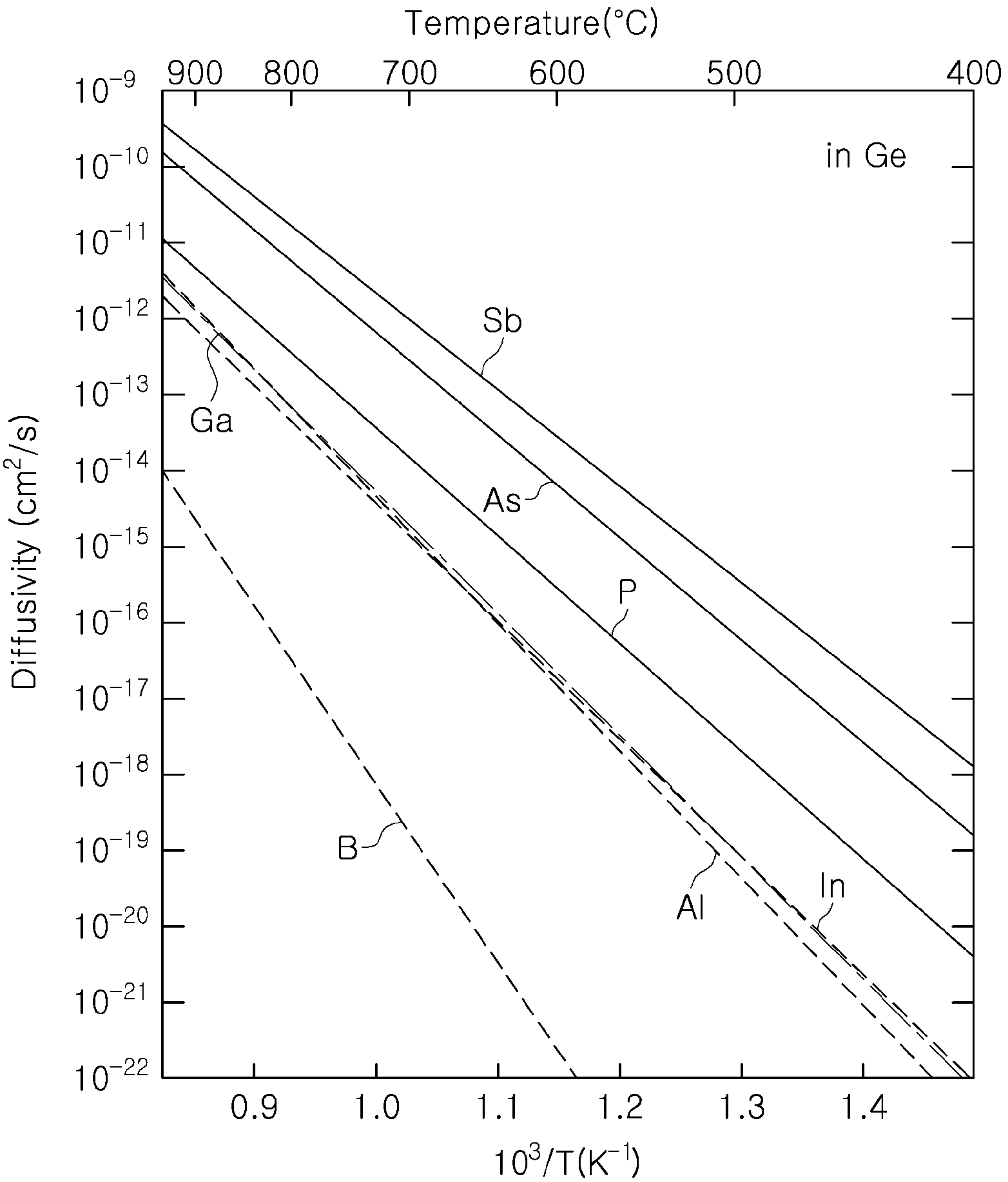

FIG. 4A is a graph illustrating diffusivity according to temperatures of various impurities when a matrix is Si, and FIG. 4B is a graph illustrating diffusivity according to temperatures of various impurities when a matrix is Ge.

Referring to FIGS. 4A and 4B, in n-type impurities (e.g., P, As, Sb, and Bi), it can be seen that diffusivity of As and Sb in Si is generally lower than diffusivity of P in Si, whereas diffusivity of As and Sb in Ge is generally higher than diffusivity of P in Ge.

In an N-MOSFET, since source/drain regions 150 mainly contain silicon, in terms of controlling dopant diffusion to prevent the short channel effect (SCE), As and Sb having a lower diffusivity than P may be advantageous as n-type impurities. As described above, a first epitaxial layer 150A may include $Si_{1-x}Ge_x$. Referring to FIGS. 4A and 4B, as a composition ratio of Ge (x) in the first epitaxial layer 150A is high, diffusivity of As and Sb may tend to be higher than diffusivity of P.

Figure 5:
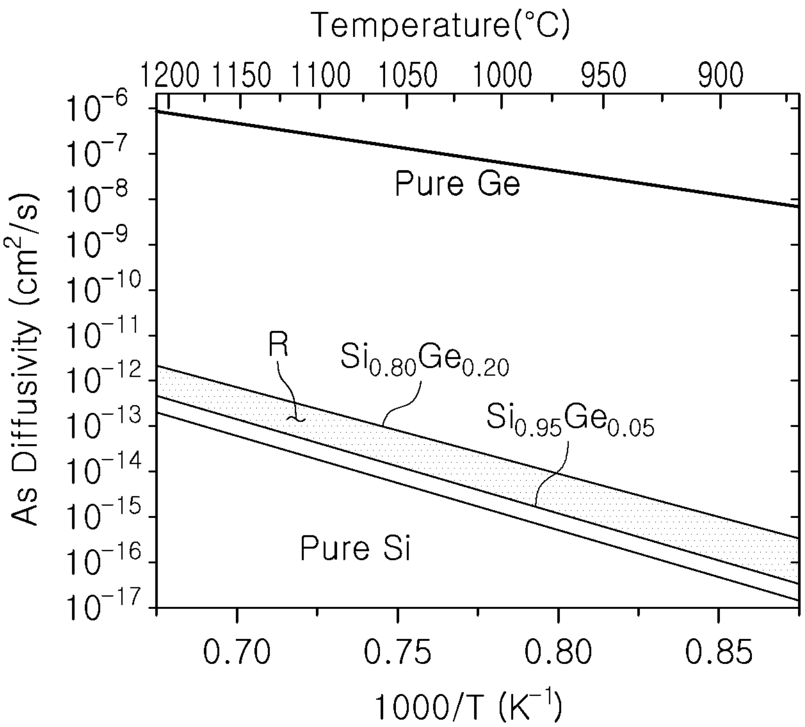
FIG. 5 is a graph illustrating diffusivity of arsenic (As) according to a composition ratio of germanium.

FIG. 5 is a graph illustrating a change in diffusivity of As according to a composition ratio of Ge ($0 \le x \le 1$) when a matrix is $Si_{1-x}Ge_x$.

Referring to FIG. 5, when a composition ratio of Ge is less than 20%, diffusivity of As may be significantly lower than diffusivity of generally pure Ge (see FIG. 4B), and may be close to diffusivity of pure Si (see FIG. 4A). In consideration of a reflow process temperature, a composition ratio of Ge of 5% or more may be viewed as an appropriate range (R). In a first epitaxial layer 150A, a composition ratio of Ge may be 15% or less, further 10% or less such that diffusivity of As may be sufficiently lower than diffusivity of P.

In this manner, a composition ratio of Ge in the first epitaxial layer 150A may be appropriately limited, to improve a structure using a reflow process and control doping of impurities to reduce a short channel effect. In some embodiments, the first epitaxial layer 150A may be SiGe, and a composition ratio of Ge may be 5% or more and 15% or less. Preferably, a composition ratio of Ge is 10% or less.

Also, an impurity concentration in the first epitaxial layer 150A may be appropriately limited, in consideration of reducing the short channel effect while securing electrical conductivity. In a case of As, experimentation was carried out and an impurity concentration in the first epitaxial layer 150A was shown to be optimal at 0.3 at % or more and 8.0 at % or less, particularly with the use of an SiGe composition such as discussed above.

A second epitaxial layer 150B may include a second impurity, different from the first impurity in order to secure sufficient conductivity. For example, in the case of an N-MOSFET, the second impurity may include P. The second epitaxial layer 150B may have an impurity concentration, higher than an impurity concentration of the first epitaxial layer 150A. In some embodiments, the impurity concentration of the second epitaxial layer 150B may have a value in a range from 1.5 to 15 times the impurity concentration of the first epitaxial layer 150A.

In some embodiments, some of the second impurities of the second epitaxial layer 150B may diffuse into a region adjacent to the first epitaxial layer 150A. In some embodiments, both the first epitaxial layer 150A and the second epitaxial layer 150B are formed together with impurities by an epitaxy process. In this case, since damage to film quality caused by an ion implantation process may be prevented, electrical characteristics of a semiconductor device 100 may be improved.

In some embodiments, since Sb also has a diffusion tendency, in a similar manner to that of As (see FIGS. 4A and 4B), Sb may be used as a second impurity of the first epitaxial layer 150A and may be used alone or together with other impurities (e.g., As). In some embodiments, similarly to the N-MOSFET, in a P-MOSFET, p-type impurities (e.g., B, Al, Ga, and In) indicated by dotted lines in FIGS. 4A and 4B may also use a difference in diffusivity according to a base material, to be selected as an impurity of the first and second epitaxial layers.

As described above, the first epitaxial layer 150A may have a composition (a composition having relatively low binding energy), different from a composition of the second epitaxial layer 150B, and may thus have a continuous surface having a smooth surface using a reflow process. Structural defects (e.g., occurrence of voids) due to discontinuous growth from each channel layers 141, 142, and 143 may be improved, and overgrowth of the uppermost channel layer 143 may be suppressed to control a shape thereof.

In addition, the first epitaxial layer 150A may have an impurity, different from an impurity of the second epitaxial layer 150B, and the first epitaxial layer 150A may have a composition satisfying a condition in which diffusivity of the first impurity is lower than that diffusivity that the second impurity would be if included in the first epitaxial layer 150A. Impurity diffusion in a region adjacent to the channel layers 141, 142, and 143 may be controlled to effectively reduce a short channel effect.

As described above, a gate structure 160 may include a gate dielectric layer 162, a gate electrode 165, gate spacer layers 164, and a gate capping layer 166.

The gate dielectric layer 162 may be disposed between an active region 105 and the gate electrode 165 and between the channel structure 140 and the gate electrode 165, as illustrated in FIG. 2. The gate dielectric layer 162 may be disposed to surround surfaces in the second direction, except for an uppermost surface of the gate electrode 165 (see FIG. 2). The gate dielectric layer 162 may extend between the gate electrode 165 and the gate spacer layers 164, but is not limited thereto. For example, the gate dielectric layer 162 may include or be formed of an oxide, a nitride, or a high-k material. The high-k material may refer to a dielectric material having a dielectric constant, higher than a dielectric constant of a silicon oxide film ($SiO_2$). The high-k material may be at least one of, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), or praseodymium oxide ($Pr_2O_3$).

The gate electrode 165 may be disposed on the active region 105 to fill between the plurality of channel layers 141, 142, and 143, and may extend over the channel structure 140. The gate electrode 165 may be spaced apart from the plurality of channel layers 141, 142, and 143 by the gate dielectric layer 162. The gate electrode 165 may include or be formed of a conductive material, and may include or be formed of, for example, a metal nitride such as a titanium nitride film (TiN), a tantalum nitride film (TaN), or a tungsten nitride film (WN), and/or a metal material such as aluminum (Al), tungsten (W), molybdenum (Mo), or the like, or a semiconductor material such as doped polysilicon. In some embodiments, the gate electrode 165 may be formed as two or more multiple layers. In some embodiments, the gate electrode 165 may be disposed across adjacent transistors, and the gate electrode 165 may be separated by a separate separation unit located between adjacent transistors.

The gate spacer layers 164 may be disposed on both (e.g., opposite) lateral surfaces of the gate electrode 165. The gate spacer layers 164 may insulate the source/drain regions 150 and the gate electrodes 165. In some embodiments, the gate spacer layers 164 may have a multilayer structure. For example, the gate spacer layers 164 may include or be formed of an oxide, a nitride, and an oxynitride, and in particular, may be formed of a low-k film. The gate capping layer 166 may be disposed on the gate electrode 165, and a lower surface and lateral surfaces thereof may be surrounded by the gate electrode 165 and the gate spacer layers 164, respectively. The gate capping layer 166 may be formed of an insulating material.

Internal spacer layers 130 may be disposed in parallel with the gate electrode 165 and between the channel structures 140. Below the third channel layer 143, the gate electrode 165 may be spaced apart and electrically separated from the source/drain regions 150 by the internal spacer layers 130. The internal spacer layers 130 may have a convex curved surface in which a lateral surface contacting the gate electrode 165 faces the gate electrode 165, but they are not limited thereto. As an example, the internal spacer layers 130 may include or be formed of an oxide, a nitride, and/or an oxynitride. In particular, the internal spacer layers 130 may be formed of a low-k film.

A contact plug 180 may pass through an interlayer insulating layer 190 to be connected to the source/drain regions 150, and may apply an electrical signal to the source/drain regions 150. The contact plug 180 may be disposed on the source/drain region 150, as illustrated in FIG. 1. In some embodiments, the contact plug 180 may be disposed to have a length, longer than a length of the source/drain regions 150 in the second direction (the Y direction). The contact plug 180 may have an inclined lateral surface in which a width of a lower portion becomes narrower than a width of an upper portion according to an aspect ratio, but is not limited thereto. The contact plug 180 may extend from an upper portion to a lower level, for example, as compared to the third channel layer 143. The contact plug 180 may be recessed onto a height level corresponding to an upper surface of the second channel layer 142, for example, but is not limited thereto. In some embodiments, the contact plug 180 may be disposed to contact along an upper surface of the source/drain regions 150 without recessing the source/drain regions 150. For example, the contact plug 180 may include or may be formed of a metal nitride such as a titanium nitride film (TiN), a tantalum nitride film (TaN), or a tungsten nitride film (WN), and/or a metal material such as aluminum (Al), tungsten (W), or molybdenum (Mo).

The interlayer insulating layer 190 may be disposed to cover the source/drain regions 150 and the gate structures 160, and may be disposed to cover a device isolation film 110 in a region not illustrated. For example, the interlayer insulating layer 190 may include or be formed of at least one of an oxide, a nitride, and an oxynitride, and may include a low-k material.

Figure 6:
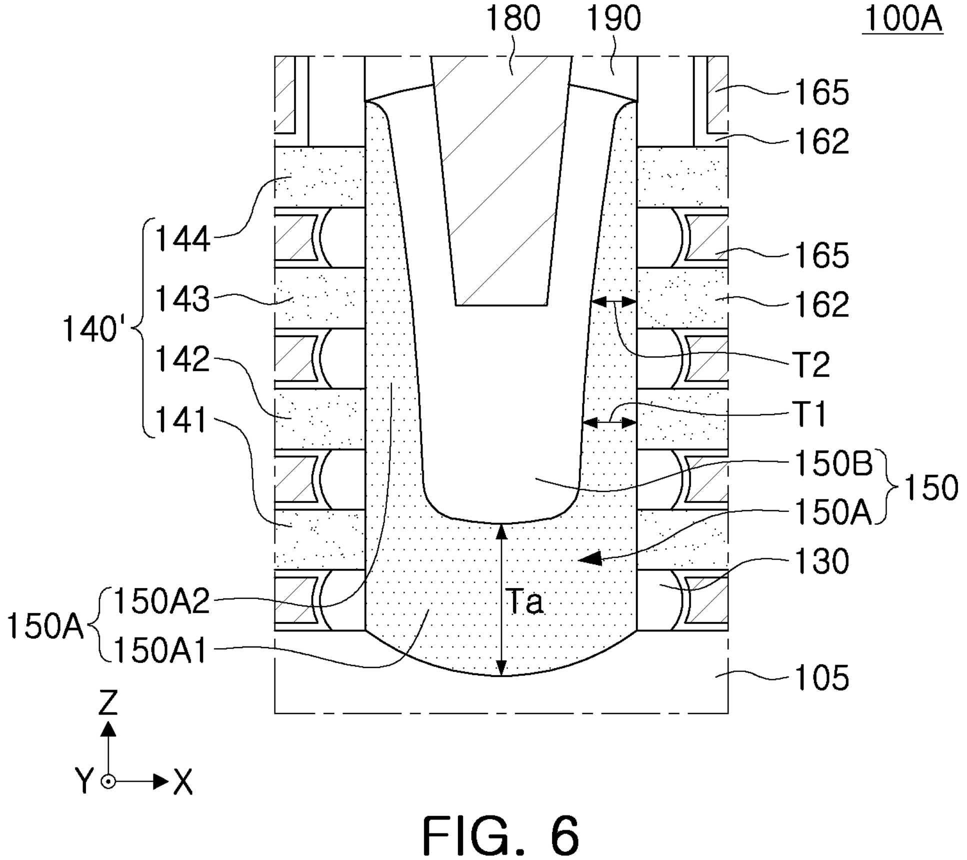
FIGS. 6 to 8 are cross-sectional views illustrating semiconductor devices according to various embodiments of the present inventive concept.
Figure 7:
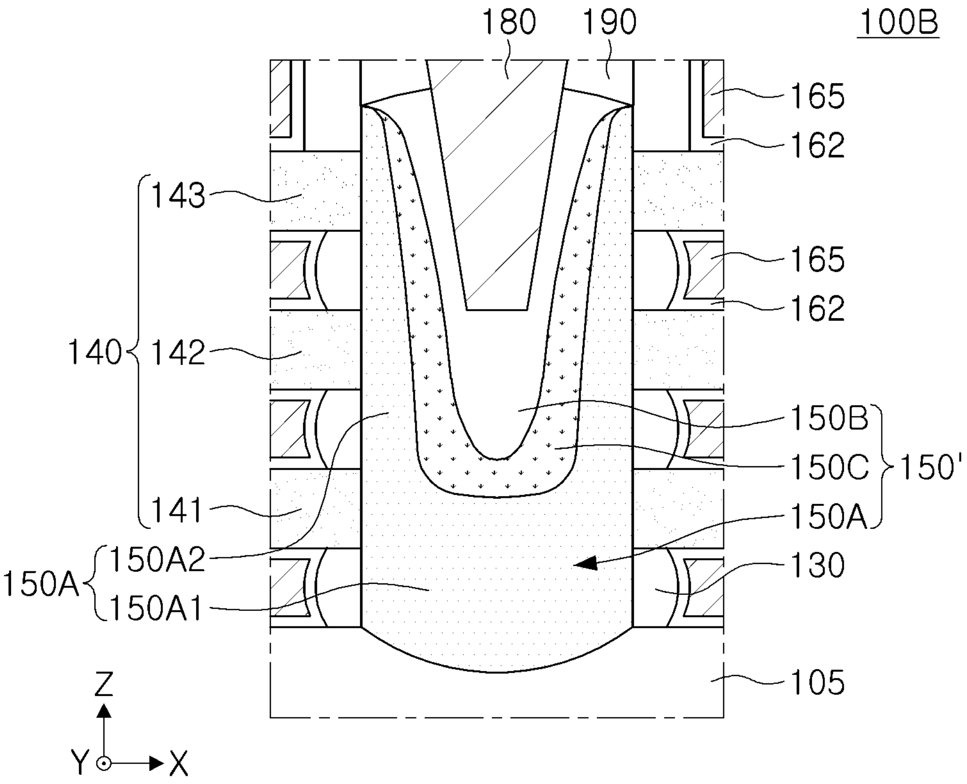
Figure 8:
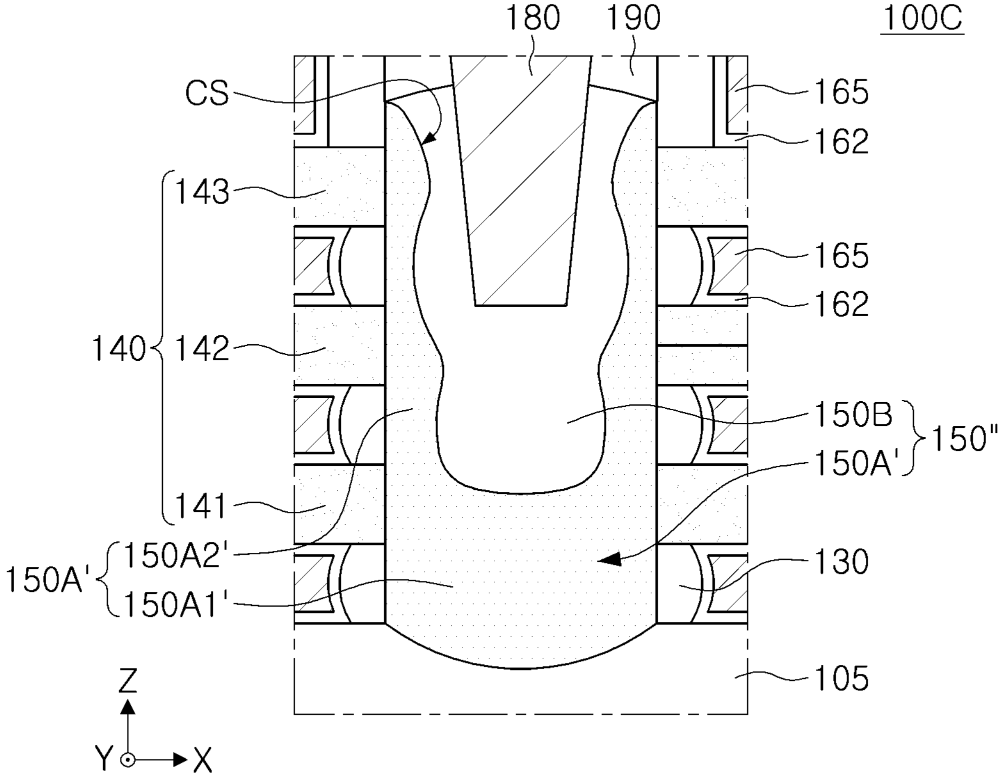

FIGS. 6 to 8 are cross-sectional views illustrating semiconductor devices according to various embodiments of the present inventive concept. FIGS. 6 to 8 are partially enlarged views illustrating a region corresponding to FIG. 3 in a respective semiconductor device.

Referring to FIG. 6, a semiconductor device 100A according to this embodiment is similar to the semiconductor device 100 illustrated in FIGS. 1 to 3, except that a channel structure 140' includes four (4) channel layers 141, 142, 143, and 144. In addition, components of this embodiment can be understood with reference to descriptions of the same or similar components of the semiconductor device 100 illustrated in FIGS. 1 to 3, unless otherwise specified.

A source/drain region 150 employed in this embodiment may include a first epitaxial layer 150A continuously disposed in a recess, and a second epitaxial layer 150B disposed on the first epitaxial layer 150A. The first epitaxial layer 150A may have a bottom portion 150A1 of the source/drain region 150 and a sidewall portion 150A2 continuously extending from the bottom portion 150A1 along lateral surfaces of the first to fourth channel layers 141, 142, 143, and 144. As shown in this embodiment, the number of channel layers may be variously changed.

Similar to the previous embodiment, since a reflow process is applied to the first epitaxial layer 150A after epitaxial growth, the sidewall portion 150A2 may be reflowed to the bottom portion 150A1. Therefore, as described above, the sidewall portion 150A2 may have a relatively smooth surface while being relatively thin, and the bottom portion 150A1 may have a thickness greater than a thickness of the sidewall portion 150A2.

In this embodiment, the thickness of the sidewall portion 150A2 may be defined as an average value (T1+T2)/2 of thicknesses of portions respectively located on lateral surfaces of the second and third channel layers 142 and 143 located in a central portion of the first to fourth channel layers 141, 142, 143, and 144. For example, in the first epitaxial layer 150A, a thickness Ta of the bottom portion 150A1 may be in a range from 3.5 to 5 times an average thickness of the sidewall portion 150A2.

In this embodiment, the first epitaxial layer 150A and the second epitaxial layer 150B may have different compositions. In some embodiments (e.g., an N-MOSFET), the first epitaxial layer 150A may be formed of silicon germanium (SiGe) as a base material (e.g., regardless of dopants or impurities). The second epitaxial layer 150B may be formed of silicon (Si) and/or silicon carbide (SiC) as a base material (e.g., regardless of dopants or impurities).

In some embodiments, the first epitaxial layer 150A may include a first impurity, and the second epitaxial layer 150B may include a second impurity, different from the first impurity.

In the composition of the first epitaxial layer 150A, the first impurity may be selected as an element having diffusivity, lower than diffusivity of the second impurity. For example, in an N-MOSFET, the first impurity may be at least one of arsenic (As) or antimony (Sb), and the second impurity may be phosphorus (P). The first epitaxial layer 150A may be SiGe, and a composition ratio of Ge may be 5% or more and 15% or less, to improve a structure using a reflow process and control doping of impurities to reduce a short channel effect. Also, an impurity concentration in the first epitaxial layer 150A may be appropriately limited in consideration of reducing a short channel effect while securing electrical conductivity. In some embodiments, the impurity concentration in the first epitaxial layer 150A is 0.3 at % or more and 8.0 at % or less. In some embodiments, an impurity concentration of the second epitaxial layer 150B is in a range from 1.5 to 15 times the impurity concentration of the first epitaxial layer 150A.

Referring to FIG. 7, a semiconductor device 100B according to this embodiment is similar to the semiconductor device 100 illustrated in FIGS. 1 to 3, except that a source/drain region further includes a third epitaxial layer 150C disposed between a first epitaxial layer 150A and a second epitaxial layer 150B. In addition, components of this embodiment can be understood with reference to descriptions of the same or similar components of the semiconductor device 100 illustrated in FIGS. 1 to 3, unless otherwise specified.

A source/drain region 150' employed in this embodiment further may include a third epitaxial layer 150C disposed between a first epitaxial layer 150A and a second epitaxial layer 150B. The third epitaxial layer 150C may be different from at least one of a composition or an impurity (a type and/or a concentration) of the first epitaxial layer 150A, and may be different from at least one of a composition or an impurity (a type and/or a concentration) of the second epitaxial layer 150B.

In some embodiments, the third epitaxial layer 150C may have a composition, identical to a composition of the second epitaxial layer 150B and an impurity concentration lower than an impurity concentration of the second epitaxial layer 150B. For example, the first epitaxial layer 150A may be formed of SiGe doped with As at a first concentration, the second epitaxial layer 150B may be formed of Si doped with P at a second concentration, and the third epitaxial layer 150C may be formed of Si doped with P at a third concentration, lower than the second concentration. For example, the first concentration may range from 0.3 atm % to 8.0 atm %, and the second concentration may have a concentration ranging from 1.5 to 15 times the first concentration. In some embodiments, additionally, the third concentration may be higher than the first concentration.

Referring to FIG. 8, a semiconductor device 100C according to this embodiment is similar to the semiconductor device 100 illustrated in FIGS. 1 to 3, except that a surface of a first epitaxial layer 150A' has a convex portion. In addition, components of this embodiment can be understood with reference to descriptions of the same or similar components of the semiconductor device 100 illustrated in FIGS. 1 to 3, unless otherwise specified.

A surface of a first epitaxial layer 150A' may have a curved surface CS in which regions corresponding to lateral surfaces of a plurality of channel layers 141, 142, and 143 are convex. The surface of the first epitaxial layer 150A' may not be sufficiently smooth, depending on conditions of growth and reflow processes of the first epitaxial layer 150A'. For example, the growth of the first epitaxial layer 150A' may be selectively grown only on the lateral surfaces of the channel layers 141, 142, and 143 to be disposed discontinuously, or (and) a reflow process may be applied. When sufficient time and temperature are not applied, a somewhat convex surface CS may remain. The convex curved surface CS may be located in a region corresponding to the lateral surfaces of the plurality of channel layers 141, 142, and 143. Overall, a wall of the sidewall portion 150A2' may have a wave-like shape. Of course, the conditions of the growth and reflow processes of the first epitaxial layer 150A' may be appropriately controlled, to have a sidewall portion 150A2' of the first epitaxial layer 150A' having a sufficiently smooth surface and thinner in an upward direction.

As described above, the first epitaxial layer 150A' may have a composition different from a composition (a composition of relatively low binding energy) of a second epitaxial layer 150B, and may have thus a continuous surface having a smooth surface using a reflow process. Structural defects due to discontinuous growth from each of the channel layers 141, 142, and 143 may be effectively improved. In addition, the first epitaxial layer 150A' may have an impurity different from an impurity of the second epitaxial layer 150B, and the first epitaxial layer 150A' may have a composition satisfying conditions in which diffusivity of a first impurity is lower than diffusivity of a second impurity. Therefore, impurity diffusion in regions adjacent to the channel layers 141, 142, and 143 may be controlled, and a short channel effect may be effectively reduced.

Figure 9:
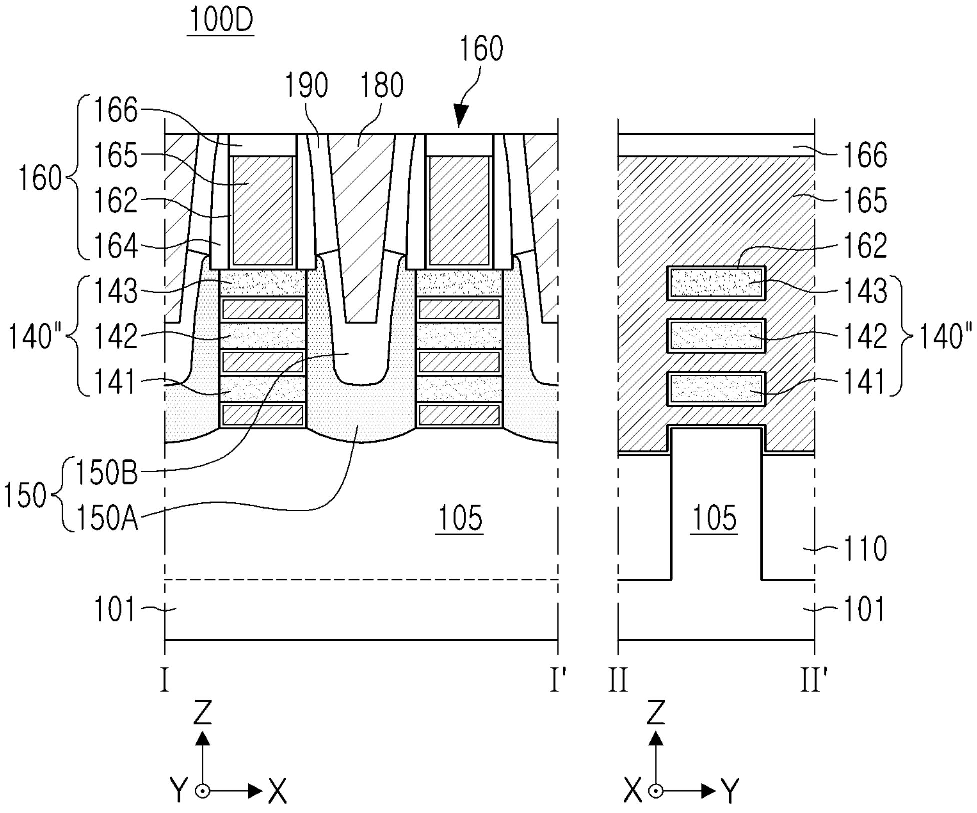
FIGS. 9 and 10 are cross-sectional views illustrating semiconductor devices according to various embodiments of the present inventive concept.
Figure 10:
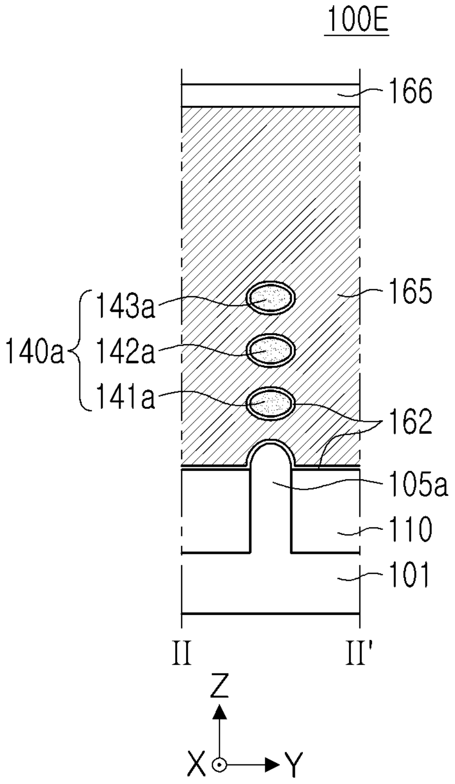

FIGS. 9 and 10 are cross-sectional views illustrating semiconductor devices according to various embodiments of the present inventive concept. In this case, FIG. 9 illustrates regions corresponding to cross-sections taken along lines I-I' and II-II' of FIG. 1, and FIG. 10 illustrates a region corresponding to a cross-section taken along line II-II' of FIG. 1.

Referring to FIG. 9, a semiconductor device 100D according to this embodiment is similar to the semiconductor device 100 illustrated in FIGS. 1 to 3, except that a channel structure 140" has a width narrower than a width of a gate structure 160 and an internal spacer layer is not included. In addition, components of this embodiment can be understood with reference to descriptions of the same or similar components of the semiconductor device 100 illustrated in FIGS. 1 to 3, unless otherwise specified.

Unlike the semiconductor device 100 according to the above-described embodiment, the semiconductor device 100D according to this embodiment may not include an internal spacer layer 130. In addition, first to third channel layers 141, 142, 143 of the channel structure 140" have a width narrower than a width of a gate structure 160. Even when the internal space layer is not employed, the gate structure 160 (especially a gate dielectric layer 162) may also be exposed between the plurality of channel layers 141, 142, and 143 together with the lateral surfaces of the plurality of channel layers on an internal sidewall of a recess for a source/drain region 150, and epitaxial growth may be discontinuously grown. First and second epitaxial layers 150A and 150B may be formed under the composition and impurity conditions described in the above-described embodiment. The first epitaxial layer 150A may be reflowed before growing the second epitaxial layer 150B, to obtain the first epitaxial layer 150A having a smooth surface and becoming thin in an upward direction.

Both lateral surfaces of the channel structures 140" in the X direction may be located below the gate structures 160. The channel structure 140" may have a relatively narrower width than the gate structure 160. Therefore, a portion of the first epitaxial layer 150A may be disposed to overlap the gate structures 160 in a direction, perpendicular to an upper surface of a substrate (the Z direction).

Referring to FIG. 10, a semiconductor device 100E according to this embodiment is similar to the semiconductor device 100 illustrated in FIGS. 1 to 3, except that a channel structure 140*a* is formed in a nanowire structure. In addition, components of this embodiment can be understood with reference to descriptions of the same or similar components of the semiconductor device 100 illustrated in FIGS. 1 to 3, unless otherwise specified.

In the semiconductor device 100E according to this embodiment, a width of an active region 105*a* and a width of the channel structure 140*a* may be different from the widths of the semiconductor device 100 of FIG. 2, respectively. The active region 105*a* and the channel structure 140*a* may have a relatively small width. Therefore, a plurality of channel layers 141*a*, 142*a*, and 143*a* of the channel structure 140*a* may have a circular shape or an elliptical shape having a small difference in length between a major axis and a minor axis, respectively, in a cross-sectional view in the Y direction. For example, in the semiconductor device 100 illustrated in FIG. 2, the plurality of channel layers 141, 142, and 143 may be nanosheets having a width of about 20 nm to about 50 nm in the Y direction. The plurality of channel layers 141*a*, 142*a*, and 143*a* employed in this embodiment may be nanowires having a width of about 3 nm to about 12 nm in the Y direction. As such, widths and shapes of the active region 105*a* and the channel structure 140*a* may be variously changed.

FIGS. 11A to 11J are cross-sectional views of major processes illustrating a method of manufacturing a semiconductor device according to an example embodiment of the present inventive concept. A manufacturing method according to this embodiment can be understood as a manufacturing method of the semiconductor device 100 illustrated in FIG. 2.

Figure 11A:
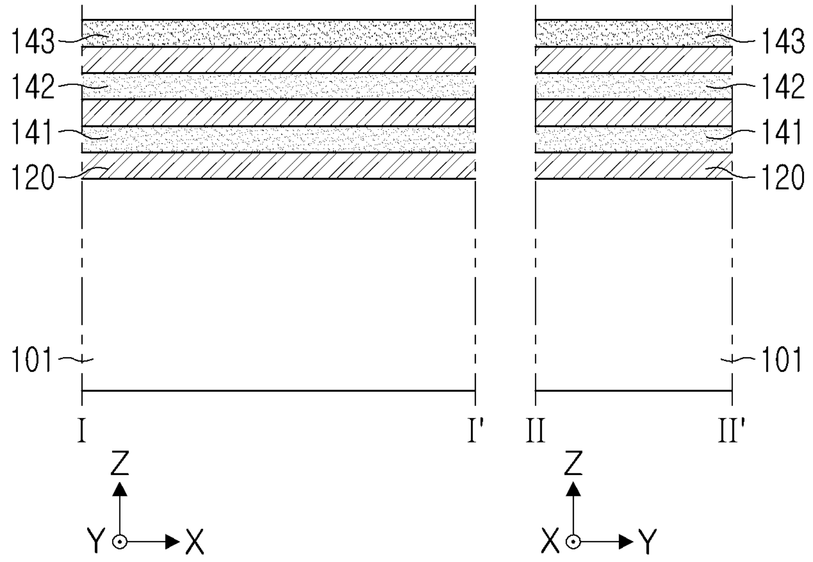
FIGS. 11A to 11J are cross-sectional views of major processes illustrating a method of manufacturing a semiconductor device according to an example embodiment of the present inventive concept.

Referring to FIG. 11A, sacrificial layers 120 and channel layers 141, 142, and 143 may be alternately stacked on a substrate 101.

The sacrificial layers 120 may be removed by a subsequent process to provide spaces for the gate dielectric layer 162 and the gate electrode 165 illustrated in FIG. 2. The sacrificial layers 120 may be formed of a material having etch selectivity with respect to the channel layers 141, 142, and 143. The channel layers 141, 142, and 143 may include a material different from the sacrificial layers 120. The sacrificial layers 120 and the channel layers 141, 142, and 143 may include or be formed of, for example, a semiconductor material including at least one of silicon (Si), silicon germanium (SiGe), or germanium (Ge), and may include different materials. The channel layers 141, 142, and 143 may include impurities, but are not limited thereto. In some embodiments, the sacrificial layers 120 may include or may be silicon germanium (SiGe), and the channel layers 141, 142, and 143 may include or may be silicon (Si).

The sacrificial layers 120 and the channel layers 141, 142, and 143 may be formed by performing an epitaxial growth process using the substrate 101 as a seed. Each of the sacrificial layers 120 and the channel layers 141, 142, and 143 may have a thickness ranging from about 1 Å to 100 nm. In some embodiments, the number of layers of the channel layers 141, 142, and 143 alternately stacked with the sacrificial layer 120 may be variously changed.

Figure 11B:
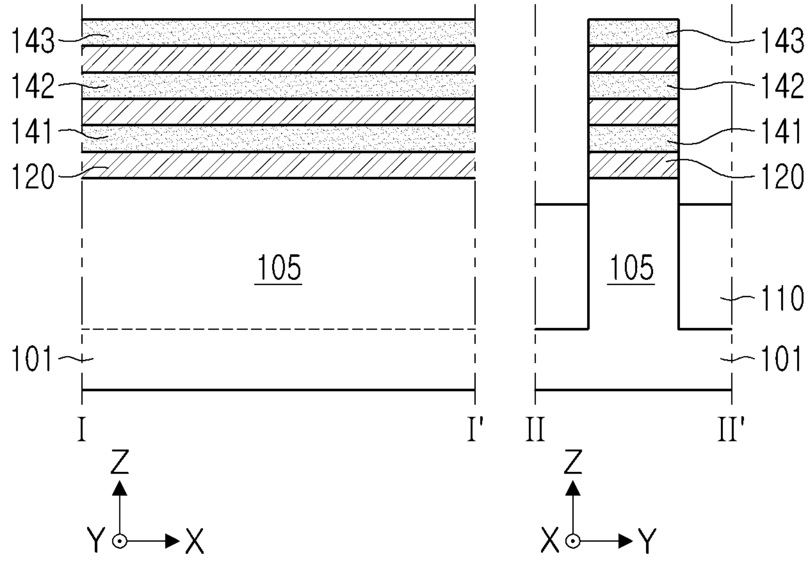

Next, referring to FIG. 11B, a portion of a stack structure of the sacrificial layers 120 and the channel layers 141, 142, and 143 and a portion of the substrate 101 may be removed to form active structures.

The active structure may include sacrificial layers 120 and channel layers 141, 142, and 143, alternately stacked with each other. In this process, a portion of the substrate 101 may be removed to further include an active region 105 protruding from an upper surface of the substrate 101. The active structures may be formed in a linear shape extending in one direction, for example, in the first direction (the X direction), and may be arranged to be spaced apart from each other in the second direction (the Y direction).

Device isolation films 110 may be formed in a region from which a portion of the substrate 101 is removed by filling an insulating material and then recessing the active region 105 to protrude. Upper surfaces of the device isolation films 110 may be formed to be lower than an upper surface of the active region 105.

Figure 11C:
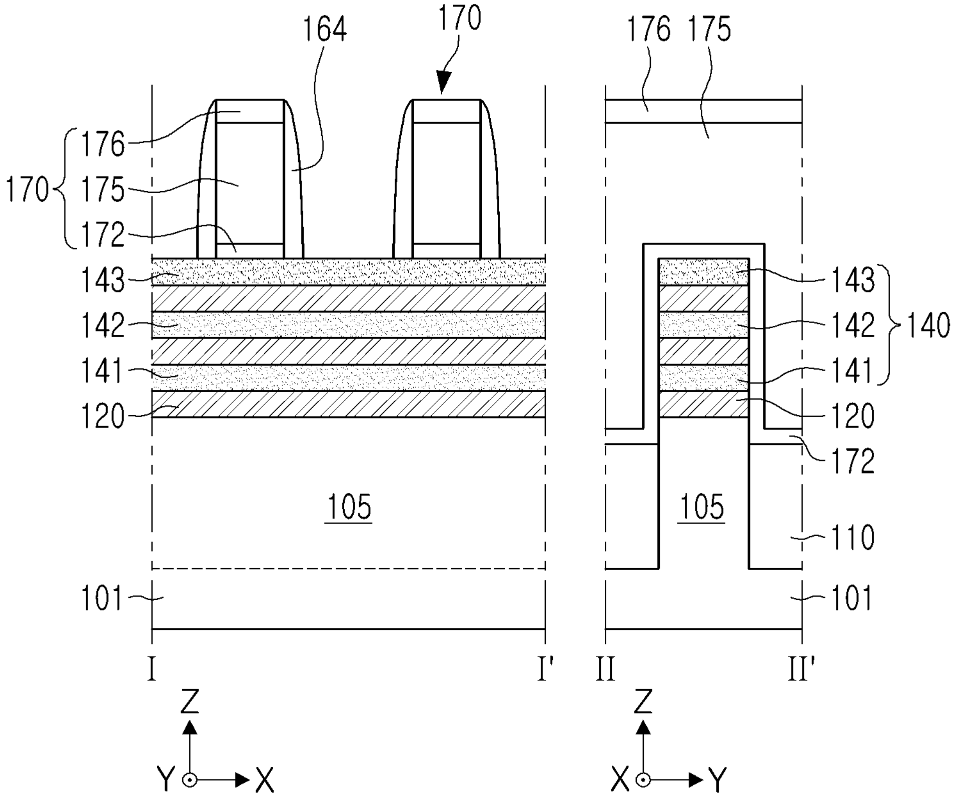

Next, referring to FIG. 11C, sacrificial gate structures 170 and gate spacer layers 164 may be formed on the active structures.

The sacrificial gate structures 170 may be sacrificial structures formed in a region in which a gate dielectric layer 162 and a gate electrode 165 are disposed on the channel structures 140, illustrated in FIG. 2, by a subsequent process. The sacrificial gate structures 170 may have a linear shape extending in the second direction (the Y direction) intersecting the active structures, and may be arranged to be spaced apart from each other in the first direction (the X direction). The sacrificial gate structure 170 may include first and second sacrificial gate layers 172 and 175 sequentially stacked, and a mask pattern layer 176.

The first and second sacrificial gate layers 172 and 175 may be patterned using the mask pattern layer 176. The first and second sacrificial gate layers 172 and 175 may be an insulating layer and a conductive layer, respectively, but are not limited thereto, and the first and second sacrificial gate layers 172 and 175 may be formed as a single layer (e.g., formed of a single material). In some embodiments, the first sacrificial gate layer 172 may include or may be formed of silicon oxide, and the second sacrificial gate layer 175 may include or be formed of polysilicon. The mask pattern layer 176 may include or be formed of silicon oxide and/or silicon nitride.

The gate spacer layers 164 may be formed on both (e.g., opposite) sidewalls of the sacrificial gate structures 170. The gate spacer layers 164 may be formed by forming a film having a uniform thickness along upper and lateral surfaces of the sacrificial gate structures 170 and the active structures, and then anisotropically etching the film. The gate spacer layers 164 may be formed of a low-k material, and may include or be, for example, at least one of SiO, SiN, SiCN, SiOC, SiON, or SiOCN.

Figure 11D:
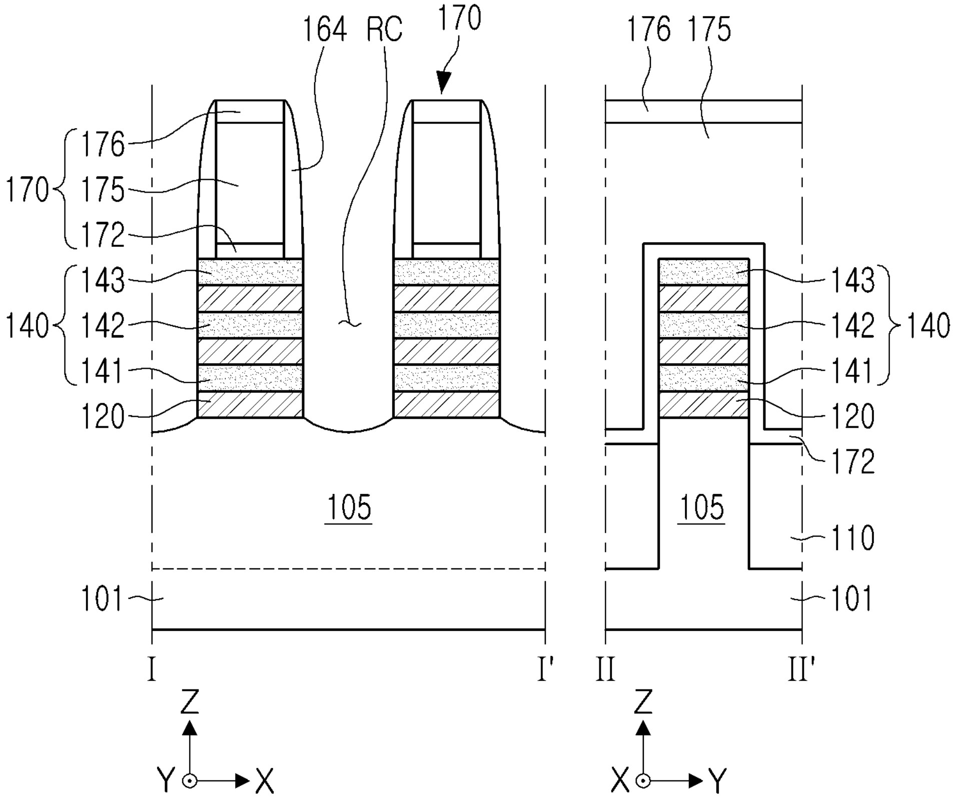

Next, referring to FIG. 11D, portions of the sacrificial layers 120 and portions of the channel layers 141, 142, and 143, exposed between the sacrificial gate structures 170, are removed to form a recess RC, to prepare channel structures 140.

The exposed portions of sacrificial layers 120 and the exposed portions of the channel layers 141, 142, and 143 may be removed using the sacrificial gate structures 170 and the gate spacer layers 164 as masks. Therefore, the channel layers 141, 142, and 143 have a defined length in the first direction (the X direction). Portions of the sacrificial layers 120 and portions of the channel structure 140 below the sacrificial gate structures 170 may be removed in lateral directions such that both lateral surfaces in the first direction (the X direction) are located below the sacrificial gate structures 170 and the gate spacer layers 164. The recesses RC may be formed on opposite sides of a sacrificial gate structure 170 (also referred to as a dummy gate), for example, using anisotropic dry etching, and may additionally be expanded using isotropic dry etching.

Figure 11E:
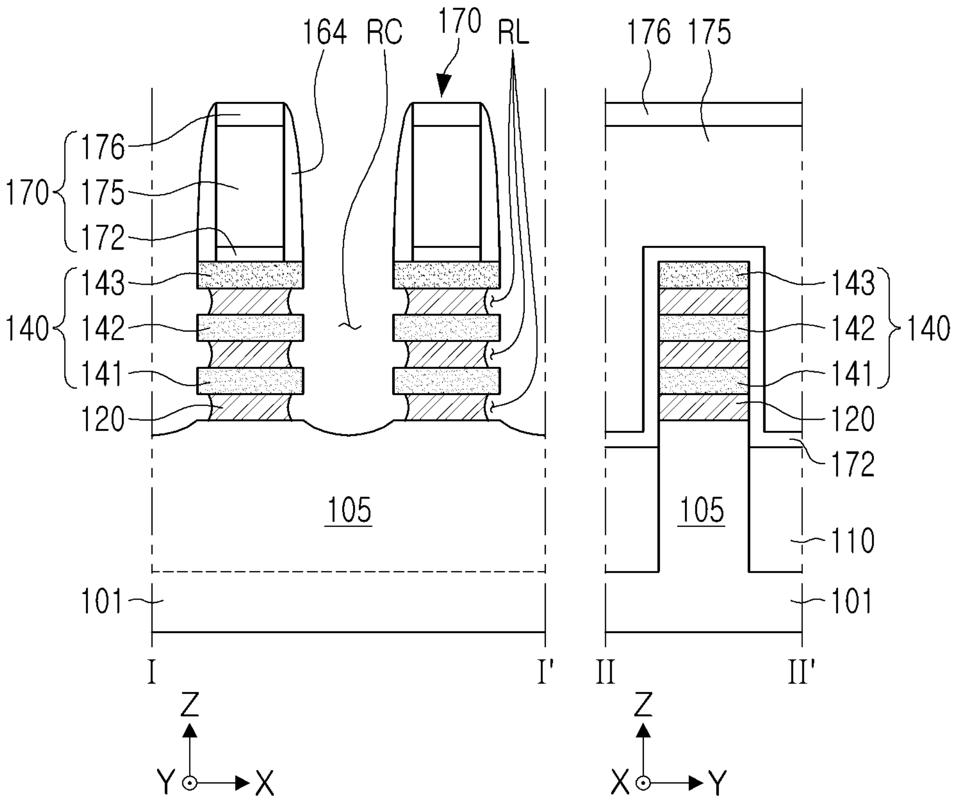

Next, referring to FIG. 11E, portions of the exposed sacrificial layers 120 may be removed in lateral directions.

The sacrificial layers 120 may be selectively etched with respect to the channel structures 140 by, for example, a wet etching process, and may be removed in lateral directions in the first direction (the X direction) to a predetermined depth. The sacrificial layers 120 may have lateral surfaces RL having a concave shape in a medial direction by the etching process as described above. Shapes of the lateral surfaces of the sacrificial layers 120 are not limited to those illustrated.

Figure 11F:
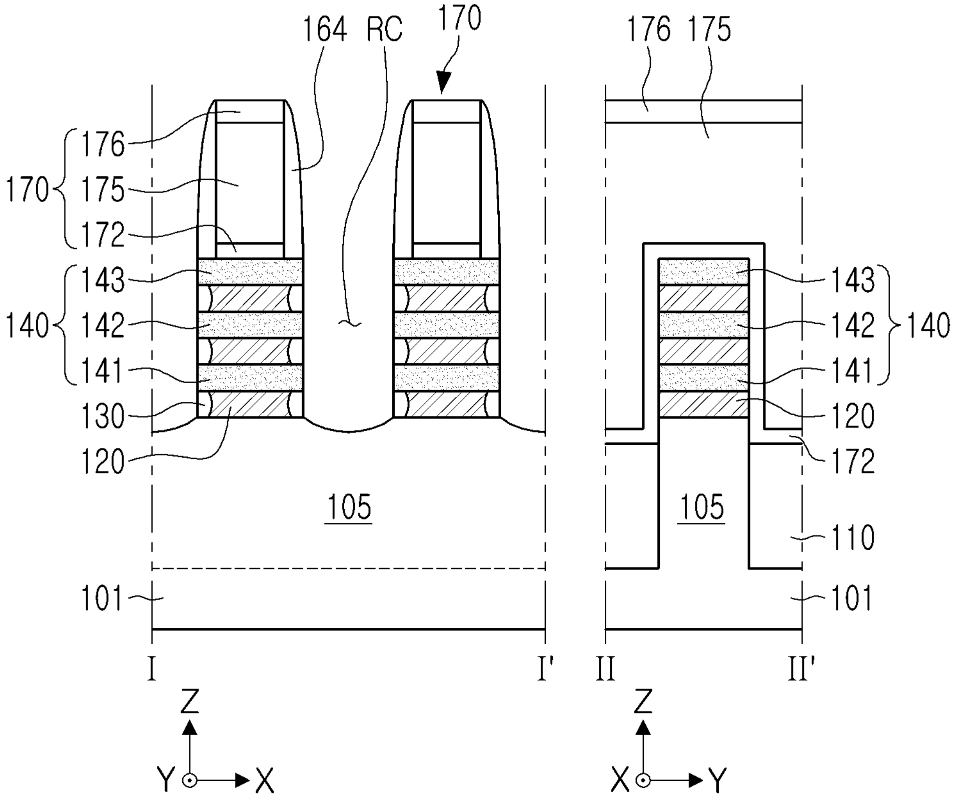

Subsequently, referring to FIG. 11F, internal spacer layers 130 may be formed in portions from which the sacrificial layers 120 are removed.

The internal spacer layers 130 may be formed by filling an insulating material into portions from which the sacrificial layers 120 are removed, and removing an insulating material deposited outside the channel structures 140. The internal spacer layers 130 may be formed of the same material as the gate spacer layers 164, but are not limited thereto. For example, the internal spacer layers 130 may include or may be formed of at least one of SiN, SiCN, SiOCN, SiBCN, or SiBN.

Figure 11G:
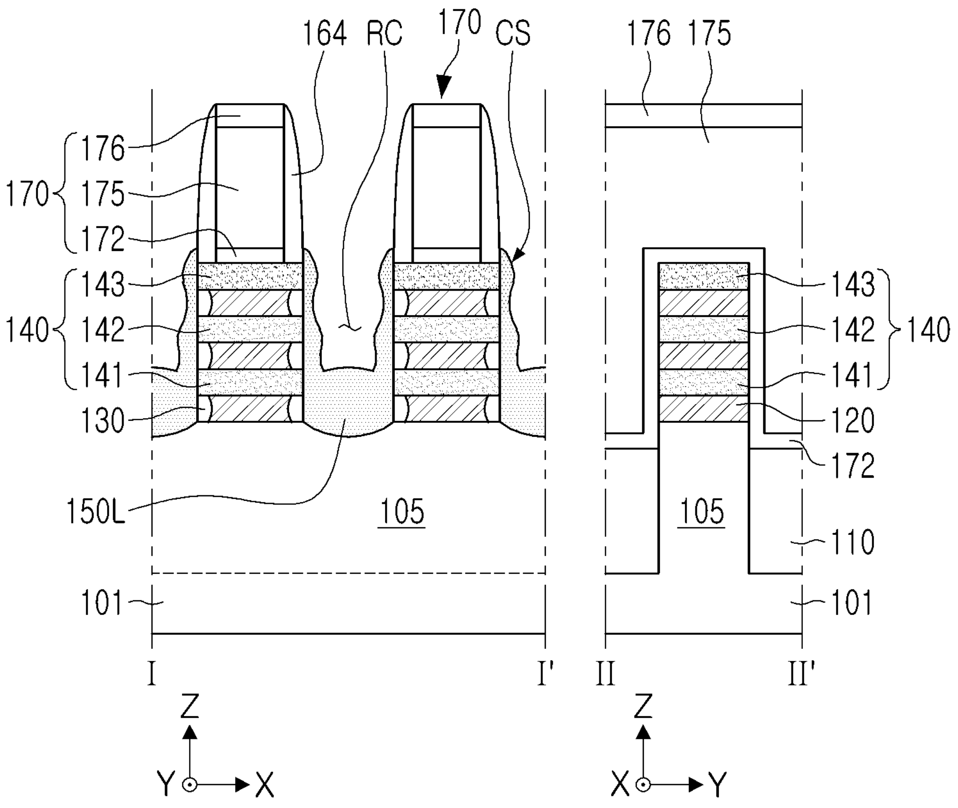

Next, referring to FIG. 11G, a first epitaxial layer 150L for forming source/drain regions may be formed in the recesses RC located on both (e.g., opposite) sides of the sacrificial gate structures 170.

The first epitaxial layer 150L may be formed of silicon germanium (SiGe) by an SEG process. A composition ratio of germanium (Ge) in the first epitaxial layer 150L may be 5% to 15%. The first epitaxial layer 150L may be mainly grown from the active region 105 and lateral surfaces of the channel layers 141, 142, and 143 on a bottom surface of the recess region RC. Growth process conditions may be controlled to merge portions formed from lateral surfaces of adjacent channel layers 141, 142, and 143 to each other. For example, the first epitaxial layer 150L may be continuously grown along a sidewall of the recess RC by controlling a growth pressure, a growth temperature, and/or a gas flow rate. Since the first epitaxial layer 150L is first grown from the lateral surfaces of the channel layers 141, 142, and 143 and then merged later, a portion located on the lateral surfaces of the channel layers 141, 142, and 143 may have a convex surface CS. In some embodiments, unlike this embodiment, the first epitaxial layer 150L may not be completely merged on the sidewall of the recess, and portions grown from the lateral surfaces of the channel layers 141, 142, and 143 may be discontinuously distributed.

A first impurity doped in the first epitaxial layer 150L may be or may include at least one of arsenic (As) or antimony (Sb). A concentration of the first impurity may be in a range from 0.3 atm % to 8.0 atm %. The first epitaxial layer 150L may be grown as an in situ doped semiconductor layer.

In this process, after growing the first epitaxial layer 150L excluding the first impurity on the bottom and lateral surfaces of the recess RC, the first impurity may be deposited on the first epitaxial layer 150L. In addition, the first impurity may be diffused into the first epitaxial layer 150L. The diffusion process of the first impurity may be performed by a separate annealing process, but in some embodiments, it may be performed by a subsequent reflow process (see FIG. 11H).

Figure 11H:
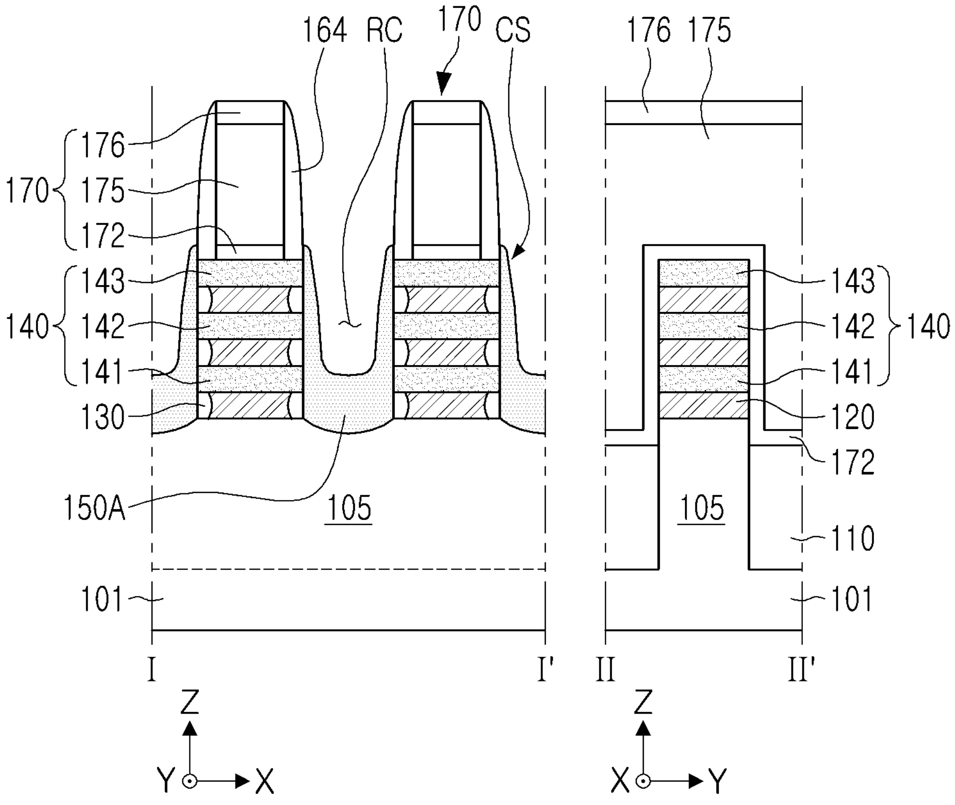

Next, referring to FIG. 11H, a first epitaxial layer 150A grown in the recess RC may be reflowed by applying a high-temperature annealing process.

By applying a high-temperature annealing process, the first epitaxial layer 150L grown in the previous process may be reflowed into a continuous layer 150A having a smoother surface. Since the first epitaxial layer 150L reflows to the bottom surface of the recess RC, the reflowed first epitaxial layer 150A may have a thickness greater than a thickness of the sidewall and becoming thin in an upward direction. For example, a thickness of the bottom of the first epitaxial layer 150A may range from 3.5 to 5 times a thickness of the sidewall (see FIG. 2).

The first epitaxial layer 150A employed in this embodiment may include SiGe having a relatively lower binding energy than Si, to lower the reflow process temperature. For example, the reflow process may be performed in a hydrogen ($H_2$) or hydrogen/nitrogen ($N_2$) atmosphere at a temperature of 700° C. to 750° C. In this manner, since the reflow process is performed at a relatively low temperature, intermixing between a constituent material (e.g., Si) of the channel layers 141, 142, and 143 and a constituent material (e.g., SiGe) of the first epitaxial layer may be reduced. In addition, a short channel effect (SCE) may be effectively suppressed. The first epitaxial layer 150A may maintain low diffusivity of the first impurity (As). In SiGe as the first epitaxial layer 150A, a composition ratio of Ge may be adjusted to 15% or less, and further to 10% or less, such that diffusivity of the first impurity may be sufficiently lower than diffusivity of the second impurity. As described above, the composition ratio of germanium (Ge) in the first epitaxial layer may be in a range from 5% to 15%.

Figure 11I:
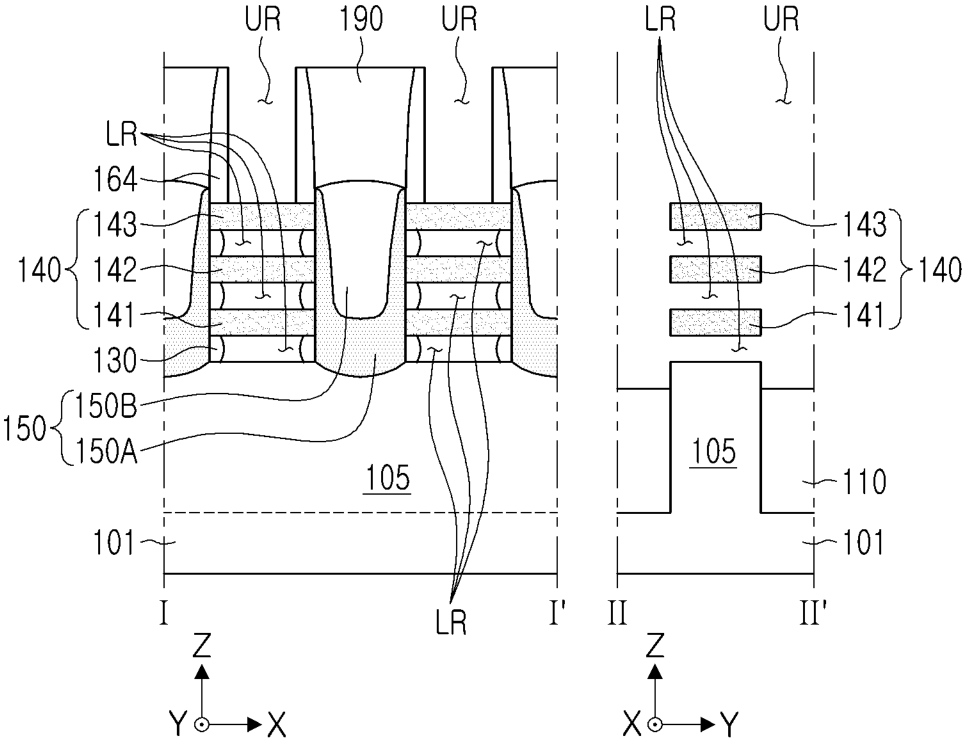

Next, referring to FIG. 11I, a second epitaxial layer 150B is formed on the first epitaxial layer 150A reflowed to fill the recess RC.

The second epitaxial layer 150B may be grown from the first epitaxial layer 150A using an SEG process. Therefore, source/drain regions 150 may be finally formed. The second epitaxial layer 150B may be an in situ doped semiconductor layer, for example, a SiP layer. A concentration of phosphorus (P) in the second epitaxial layer 150B may be greater than a concentration of arsenic (As) in the first epitaxial layer 150A.

The second epitaxial layer 150B may have a shape similar to an ellipse, together with the first epitaxial layer 150A. The second epitaxial layer 150B may be formed to fill sidewall portions 150A2 of the first epitaxial layer 150A disposed on both lateral surfaces of the recess RC in the first direction (the X direction). The second epitaxial layer 150B may have a relatively planar or slightly convex upper surface.

Figure 11J:
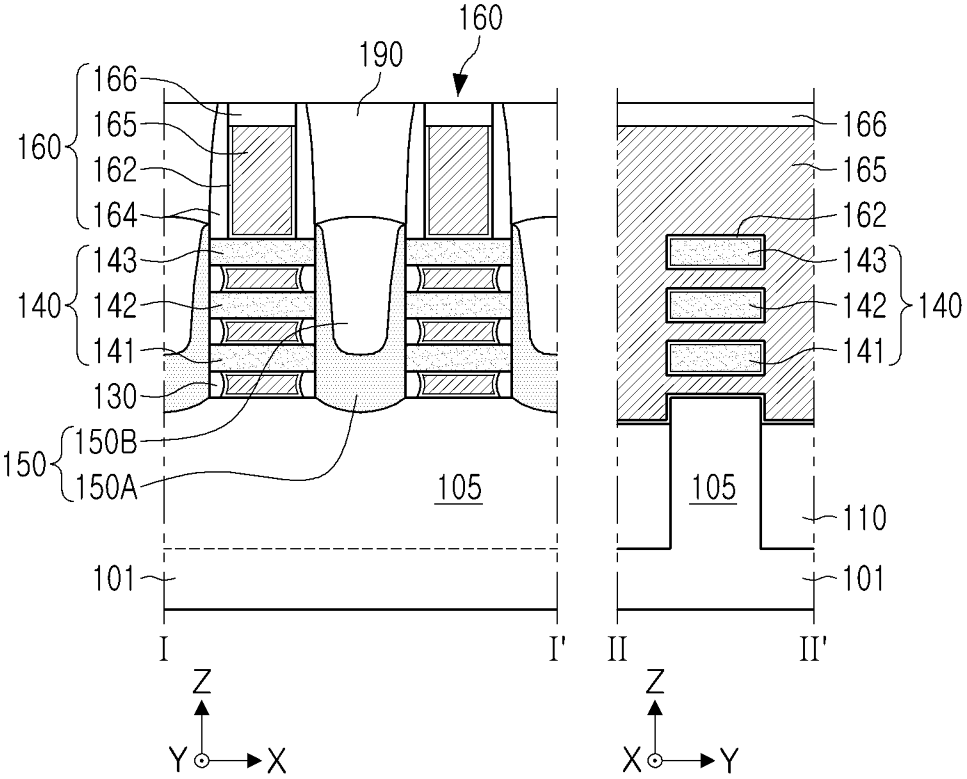

Next, referring to FIG. 11J, interlayer insulating layer 190 is formed, the sacrificial layers 120 and the sacrificial gate structures 170 may be removed, and gate structures 160 may be formed in upper gap regions UR and lower gap regions LR.

The interlayer insulating layer 190 may be prepared by forming an insulating layer covering the sacrificial gate structures 170 and the source/drain regions 150, and performing a planarization process. The sacrificial layers 120 and the sacrificial gate structure 170 may be selectively removed with respect to the gate spacer layers 164, the interlayer insulating layer 190, and the channel structure 140. First, the sacrificial gate structures 170 may be removed to form the upper gap regions UR, and then the sacrificial layers 120 exposed through the upper gap regions UR may be removed to form the lower gap regions LR. For example, when the sacrificial layers 120 include silicon germanium (SiGe) and the channel structure 140 includes silicon (Si), the sacrificial layers 120 may be selectively removed by performing a wet etching process using peracetic acid as an etchant. During the removal process, the source/drain regions 150 may be protected by the interlayer insulating layer 190 and the internal spacer layers 130.

Gate dielectric layers 162 may be formed to conformally cover inner surfaces of the upper gap regions UR and the lower gap regions LR. After forming gate electrodes 165 to completely fill the upper and lower gap regions UR and LR, upper portions of the gate electrodes 165 may be removed to a predetermined depth in the upper gap regions UR. A gate capping layer 166 may be formed in regions in which the gate electrodes 165 are removed from the upper gap regions UR. Therefore, gate structures 160 including the gate dielectric layer 162, the gate electrode 165, the gate spacer layers 164, and the gate capping layer 166 may be formed.

Next, the semiconductor device 100 illustrated in FIG. 2 may be manufactured by forming a contact plug 180 connected to the source/drain regions 150 through the interlayer insulating layer 190.

First, a contact hole connected to the source/drain regions 150 may be formed to pass through the interlayer insulating layer 190, and a conductive material may be buried in the contact hole to form a contact plug 180. A lower surface of the contact hole may be recessed into the source/drain regions 150 or may have a curvature along an upper surface of the source/drain regions 150.

Figure 12:
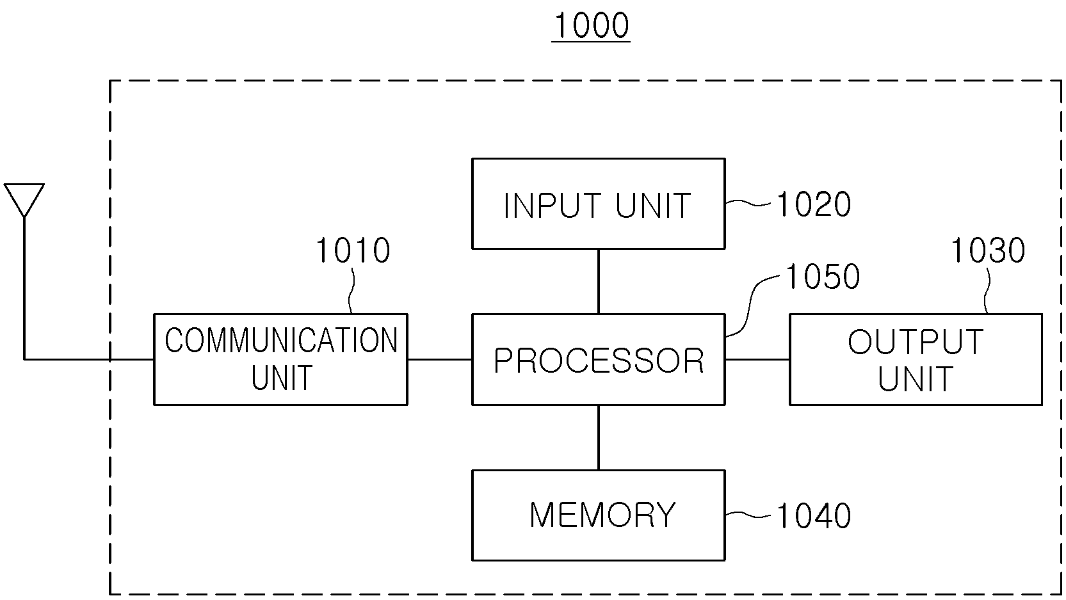
FIG. 12 is a block diagram illustrating an electronic device including a semiconductor device according to an embodiment of the present inventive concept.

FIG. 12 is a block diagram illustrating an electronic device including a semiconductor device according to an embodiment of the present inventive concept.

Referring to FIG. 12, an electronic device 1000 according to this embodiment may include a communication unit 1010, an input unit 1020, an output unit 1030, a memory 1040, and a processor 1050.

The communication unit 1010 may include a wired/wireless communication module, and may include a wireless internet module, a short-range communication module, a GPS module, a mobile communication module, and the like. The wired/wireless communication module included in the communication unit 1010 may be connected to an external communication network according to various communication standards, to transmit and receive data.

The input unit 1020 may be a module provided for a user to control an operation of the electronic device 1000, and may include a mechanical switch, a touch screen, a voice recognition module, and the like. In addition, the input unit 1020 may include a mouse operating in a track ball or laser pointer method, or a finger mouse device, and may further include various sensor modules through which a user inputs data.

The output unit 1030 may output information processed by the electronic device 1000 in a form of audio or video, and the memory 1040 may store a program for processing and controlling the processor 1050, or data, or the like. The processor 1050 may store or retrieve data by transmitting a command to the memory 1040 according to a required operation.

The memory 1040 may be embedded in the electronic device 1000 or communicate with the processor 1050 through a separate interface. When communicating with the processor 1050 through the separate interface, the processor 1050 may store or retrieve data in the memory 1040 through various interface standards such as SD, SDHC, SDXC, MICRO SD, USB, or the like.

The processor 1050 may control an operation of each of the units included in the electronic device 1000. The processor 1050 may perform control and processing related to a voice call, a video call, data communications, or the like, or may perform control and processing for multimedia playback and management. In addition, the processor 1050 may process an input transmitted from a user through the input unit 1020, and may output results thereof with the output unit 1030. In addition, as described above, the processor 1050 may store data used for controlling the operation of the electronic device 1000 in the memory 1040, or may retrieve data used for controlling the operation of the electronic device 1000 in the memory 1040 from the memory 1040. At least one of the processor 1050 or the memory 1040 may include various semiconductor devices described above with reference to FIGS. 1 to 3 and 6 to 10.

Figure 13:
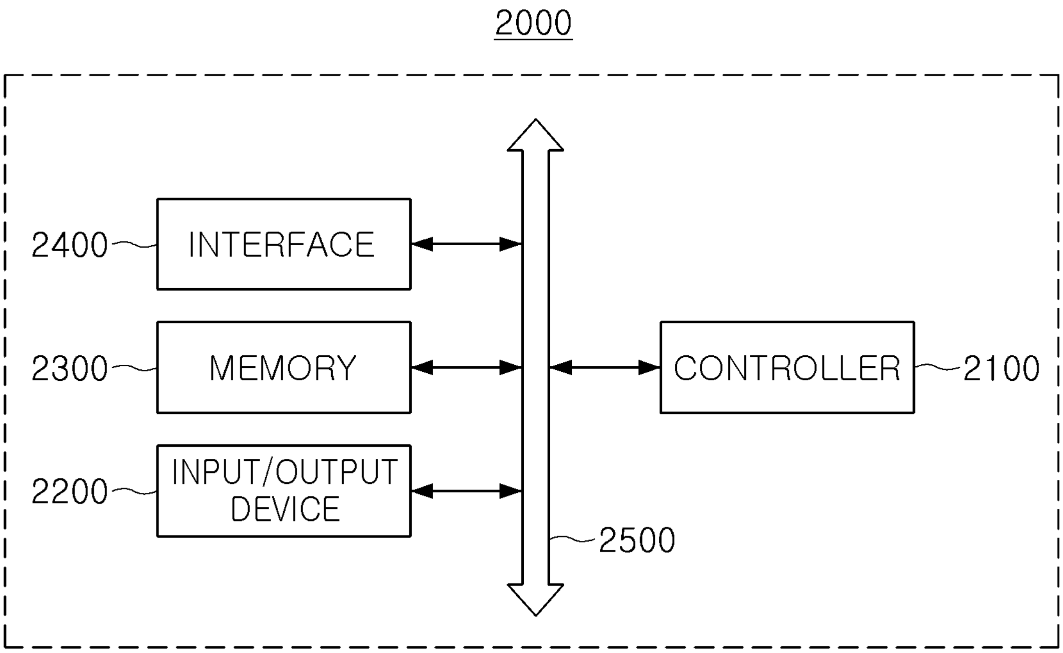
FIG. 13 is a schematic diagram illustrating a system including a semiconductor device according to an embodiment of the present inventive concept.

FIG. 13 is a schematic diagram illustrating a system including a semiconductor device according to an embodiment of the present inventive concept.

Referring to FIG. 13, a system 2000 may include a controller 2100, an input/output device 2200, a memory 2300, and an interface 2400. The system 2000 may be a mobile system or a system that transmits or receives information. The mobile system may be a PDA, a portable computer, a web tablet, a wireless phone, a mobile phone, a digital music player, or a memory card.

The controller 2100 may play a role in executing a program and controlling the system 2000. The controller 2100 may be, for example, a microprocessor, a digital signal processor, a microcontroller, or a similar device.

The input/output device 2200 may be used to input or output data of the system 2000. The system 2000 may use the input/output device 2200 to be connected to an external device, such as a personal computer or a network, and exchange data with the external device. The input/output device 2200 may be, for example, a keypad, a keyboard, or a display. The memory 2300 may store codes and/or data for operation of the controller 2100, and/or may store data processed by the controller 2100.

The interface 2400 may be a data transmission path between the system 2000 and other external devices. The controller 2100, the input/output device 2200, the memory 2300, and the interface 2400 may communicate with each other through a bus 2500. At least one of the controller 2100 and the memory 2300 may include various semiconductor devices described above with reference to FIGS. 1 to 3 and 6 to 10.

By controlling a structure of a source/drain region, a semiconductor device having improved electrical characteristics and a manufacturing method thereof may be provided.

Various advantages and effects of the present inventive concept are not limited to the above description, and can be more easily understood in the process of describing specific embodiments of the present inventive concept.

While example embodiments have been illustrated and described above, it will be apparent to those skilled in the art that modifications and variations could be made without departing from the scope of the present invention as defined by the appended claims.

What is claimed is:

1. A semiconductor device comprising:

an active region disposed on a substrate and extending in a first direction;

a plurality of channel layers disposed on the active region to be spaced apart from each other in a vertical direction, perpendicular to an upper surface of the substrate;

a gate structure disposed on the substrate, extending in a second direction, intersecting the plurality of channel layers, and surrounding each of the plurality of channel layers; and a source/drain region disposed on the active region on at least one lateral surface of the gate structure, and connected to each of the plurality of channel layers, wherein the source/drain region includes:

a first epitaxial layer having a lower end portion and a sidewall portion extending continuously along lateral surfaces of the plurality of channel layers from the lower end portion, the first epitaxial layer having a composition including a first base material doped with a first impurity; and a second epitaxial layer disposed on the first epitaxial layer, having a composition including a second base material different from the first base material of the first epitaxial layer, and doped with a second impurity, different from the first impurity, wherein diffusivity of the first impurity in the first base material of the first epitaxial layer is lower than the diffusivity that the second impurity would have in the first base material of the first epitaxial layer, wherein the first epitaxial layer comprises silicon germanium (SiGe) as the first base material, and the second epitaxial layer comprises silicon (Si) as the second base material, and the first impurity comprises at least one of arsenic (As) or antimony (Sb), and the second impurity comprises phosphorus (P), and wherein a composition ratio of germanium (Ge) in the first epitaxial layer within a range of 8% to 10%.

2. The semiconductor device of claim 1, wherein the first epitaxial layer comprises the first impurity having a first concentration, and the second epitaxial layer comprises the second impurity having a second concentration, higher than the first concentration.

3. The semiconductor device of claim 2, wherein the second concentration is within a range of 1.5 to 15 times the first concentration.

4. The semiconductor device of claim 3, wherein the first concentration is within a range of 0.3 at % to 8.0 at %.

5. The semiconductor device of claim 1, wherein the lower end portion of the first epitaxial layer has a thickness, perpendicular to a surface on which it is formed, greater than a thickness of the sidewall portion of the first epitaxial layer.

6. The semiconductor device of claim 5, wherein the thickness of the lower end portion of the first epitaxial layer is within a range of 3.5 to 5 times the thickness of the sidewall portion of the first epitaxial layer on an intermediate channel layer among the plurality of channel layers.

7. The semiconductor device of claim 1, wherein the first epitaxial layer contacts the lateral surfaces of the plurality of channel layers.

8. The semiconductor device of claim 1, further comprising internal spacer layers disposed below lower surfaces of the plurality of channel layers and on lateral surfaces of the gate structure in the first direction.

9. The semiconductor device of claim 1, wherein the source/drain region further comprises a third epitaxial layer disposed between the first epitaxial layer and the second epitaxial layer.

10. The semiconductor device of claim 9, wherein the third epitaxial layer has a composition identical to a composition of the second epitaxial layer, and has an impurity concentration lower than an impurity concentration of the second epitaxial layer.

11. The semiconductor device of claim 1, wherein the sidewall portion of the first epitaxial layer has a thickness decreasing in the vertical direction toward an upper portion of the first epitaxial layer.

12. The semiconductor device of claim 1, wherein the first impurity comprises antimony (Sb).

13. A semiconductor device comprising:

an active region disposed on a substrate and extending in a first direction;

a plurality of channel layers disposed on the active region to be spaced apart from each other in a vertical direction, perpendicular to an upper surface of the substrate;

a gate structure disposed on the substrate, extending in a second direction, intersecting the plurality of channel layers, and surrounding each of the plurality of channel layers; and source/drain regions disposed on the active region on opposite sides of the gate structure and connected to each of the plurality of channel layers, wherein each of the source/drain regions comprises:

a first epitaxial layer having a lower end portion and a sidewall portion extending continuously along lateral surfaces of the plurality of channel layers from the lower end portion, the first epitaxial layer including as a base material silicon germanium (SiGe), the SiGe doped with at least one first impurity selected from arsenic (As) and antimony (Sb), and a second epitaxial layer disposed on the first epitaxial layer and including as a base material silicon (Si), the Si doped with phosphorus (P) as a second impurity, and wherein a composition ratio of germanium (Ge) in the first epitaxial layer is within a range of 8% to 10%.

14. The semiconductor device of claim 13, wherein the first epitaxial layer extends above an upper surface of an uppermost channel layer among the plurality of channel layers.

15. The semiconductor device of claim 13, wherein the first impurity comprises antimony (Sb).

16. A semiconductor device comprising:

an active region disposed on a substrate and extending in a first direction;

a plurality of channel layers disposed on the active region to be spaced apart from each other in a vertical direction, perpendicular to an upper surface of the substrate;

a gate structure disposed on the substrate, extending in a second direction, intersecting the plurality of channel layers, and surrounding each of the plurality of channel layers;

internal spacer layers disposed below each of the plurality of channel layers and disposed on opposite sides of the gate structure in the first direction; and source/drain regions disposed on the active region on the opposite sides of the gate structure, each source/drain region connected to a set of channel layers of the plurality of channel layers, wherein each of the source/drain regions comprises:

a first epitaxial layer having a sidewall portion and a lower end portion continuously formed with the sidewall portion, wherein the sidewall portion contacts lateral surfaces of a respective set of channel layers of the plurality of channel layers, and the first epitaxial layer is doped with a first impurity having a first concentration, and a second epitaxial layer disposed on the first epitaxial layer, having a second base material different from a first base material of the first epitaxial layer, and doped with a second impurity having a second concentration different from the first impurity, wherein diffusivity of the first impurity in the base material of the first epitaxial layer is lower than diffusivity that would result from the second impurity being included in the base material of the first epitaxial layer, wherein the first epitaxial layer comprises silicon germanium (SiGe) as the first base material, and the second epitaxial layer comprises silicon (Si) as the second base material, and the first impurity comprises at least one of arsenic (As) or antimony (Sb), and the second impurity comprises phosphorus (P), and wherein a composition ratio of germanium (Ge) in the first epitaxial layer is within a range of 8% to 10%.

17. The semiconductor device of claim 16, further comprising a third epitaxial layer disposed between the first epitaxial layer and the second epitaxial layer, wherein the third epitaxial layer has a composition identical to a composition of the second epitaxial layer, and has an impurity concentration lower than an impurity concentration of the second epitaxial layer.

18. The semiconductor device of claim 16, wherein the first impurity comprises antimony (Sb).

* * * * *